(12) United States Patent
Watanabe et al.

(10) Patent No.: US 8,728,614 B2
(45) Date of Patent: May 20, 2014

(54) BACKSIDE PROTECTIVE FILM FOR SOLAR CELL, METHOD FOR PRODUCING SAME, AND SOLAR CELL MODULE

(75) Inventors: Atsushi Watanabe, Tokyo (JP); Masanori Hashimoto, Tokyo (JP)

(73) Assignee: Techno Polymer Co., Ltd., Tokyo (JP)

( * ) Notice: Subject to any disclaimer, the term of this patent is extended or adjusted under 35 U.S.C. 154(b) by 0 days.

(21) Appl. No.: 13/696,682

(22) PCT Filed: Apr. 19, 2011

(86) PCT No.: PCT/JP2011/059653
§ 371 (c)(1),
(2), (4) Date: Nov. 7, 2012

(87) PCT Pub. No.: WO2011/138897
PCT Pub. Date: Nov. 10, 2011

(65) Prior Publication Data
US 2013/0056064 A1   Mar. 7, 2013

(30) Foreign Application Priority Data

May 7, 2010   (JP) ................................. 2010-107669

(51) Int. Cl.
*B32B 7/02* (2006.01)
(52) U.S. Cl.
USPC ............................. 428/215; 136/256; 264/1.7
(58) Field of Classification Search
USPC ............................. 428/215; 264/1.7; 136/256
See application file for complete search history.

(56) References Cited

U.S. PATENT DOCUMENTS

2011/0043901 A1   2/2011   Watanabe et al.

FOREIGN PATENT DOCUMENTS

| JP | 2007 103813 | 4/2007 |
| JP | 2007 128943 | 5/2007 |
| JP | 2009 119864 | 6/2009 |
| JP | 2009 181989 | 8/2009 |
| JP | 2009-181989 A | 8/2009 |
| WO | WO 2009/054450 A1 | 4/2009 |
| WO | WO 2009054450 A1 * | 4/2009 |
| WO | WO 2009/142191 A1 | 11/2009 |
| WO | WO 2010038875 A1 * | 4/2010 |

OTHER PUBLICATIONS

International Search Report Issued Jul. 26, 2011 in PCT/JP11/59653 Filed Apr. 19, 2011.
U.S. Appl. No. 13/698,303, filed Nov. 16, 2012, Watanabe, et al.
The Extended European Search Report issued Aug. 21, 2013, in Application No. / Patent No. 11777416.6—1555 / 2568509 PCT/JP2011059653.

* cited by examiner

*Primary Examiner* — Ling Choi
*Assistant Examiner* — Wenwen Cai
(74) *Attorney, Agent, or Firm* — Oblon, Spivak, McClelland, Maier & Neustadt, L.L.P.

(57) ABSTRACT

Disclosed is a backside protective film (1) for a solar cell, which sequentially has a first resin layer (11), a second resin layer (12) and a third resin layer (13). Both the first resin layer and second resin layer include a rubber containing reinforced aromatic vinyl-based resin having a maximum glass transition temperature of 90-120° C. and have a thickness of 10-300 μm. The first resin layer includes an infrared transmissible coloring agent, while the second resin layer includes a white-based coloring agent. The third resin layer includes a saturated polyester resin and has a thickness of 10-300 μm. The third resin layer has a dimension change ratio between before and after the film is left to stand still at a temperature of 135° C. for 30 minutes of ±0.5% or less.

17 Claims, 3 Drawing Sheets

BACKSIDE PROTECTIVE FILM FOR SOLAR CELL, METHOD FOR PRODUCING SAME, AND SOLAR CELL MODULE

TECHNICAL FIELD

The present invention relates to a backside protective film for solar cell which has a dark-colored external appearance, which has a property to absorb visible light therein, transmits an infrared light therethrough upon irradiation of light thereto and prevents heat storage, and which is excellent in adhesiveness to a filling unit that contains an ethylene vinyl acetate copolymer composition or the like and that has solar cell elements embedded therein, heat resistance, flexibility, scratch resistance and durability to a thermal cycle, and a production method thereof, and a solar cell module having the backside protective film for solar cell.

BACKGROUND ART

Recently, emphasized attention has been directed to a solar cell as energy supplying means, instead of petroleum as an energy source tending to generate carbon dioxide leading to global warming. Demands for solar cells have also been increased, in a manner to demand stable supply and decreased costs of various members for constituting a solar cell module to be included in a solar cell. Further, demand has also been enhanced, for improvement of a power generation efficiency of the solar cell.

The solar cell module is configured: to include numerous plate-like solar cell elements arranged to be mutually serially or parallelly wired; and to be packaged into a unit so as to protect the elements. Further, such a solar cell module is typically structured to have a surface on which a solar light impinges and which is covered by a glass plate, in an exemplary manner that gaps of solar cell elements are filled with a composition containing an ethylene vinyl acetate copolymer or the like which is high in transparency and excellent in moisture resistance to thereby form a filling unit; and then a back surface (a lower surface of the filling unit) is sealed with a backside protective film for solar cell.

In case of arranging a solar cell having a solar cell module on a roof of a house or the like, it is preferable for the solar cell to be colored in a dark color such as black from a viewpoint of external appearance, and as such, backside protective films for solar cell colored in a dark color have been brought to be used.

Known examples of a film colored in a dark color include: a sheet consisting of a low heat-storage thermoplastic resin composition containing a thermoplastic resin and an inorganic pigment having an infrared reflective property (See Patent Document 1); and a sheet provided, at its surface, with a black resin layer containing a perylene-based pigment in a manner to reflect a near-infrared light by exhibiting a reflectivity of 30% or more to a light at a wavelength ranging from 800 to 1,100 nm, thereby preventing heat storage therein (See Patent Document 2).

Further known is a laminated body including: a thermoplastic resin layer having a higher heat resistance; an infrared transmissible colored resin layer which is arranged on one side of the thermoplastic resin layer; and a colored resin layer having a higher reflectivity to light which is arranged at the other side of the thermoplastic resin layer (See Patent Document 3).

PRIOR ART DOCUMENTS

Patent Document

Patent Document 1: JP-A 2007-103813
Patent Document 2: JP-A 2007-128943
Patent Document 3: JP-A 2009-119864

SUMMARY OF THE INVENTION

Problems to be Solved by the Invention

It is an object of the present invention to provide a backside protective film for solar cell which has a dark-colored external appearance, which is low in heat storage upon receipt of a light such as solar light onto a surface of the film at a first resin layer side, and which is excellent in adhesiveness to a member including an ethylene vinyl acetate copolymer, heat resistance, flexibility, scratch resistance and durability to a thermal cycle, and a production method thereof, and a solar cell module having the backside protective film for solar cell.

Means for Solving Problems

The present invention is as follows.
1. A backside protective film for solar cell comprising a first resin layer, a second resin layer, and a third resin layer, sequentially, characterized in that the first resin layer is an infrared transmissible colored resin layer which comprises a rubber containing aromatic vinyl-based resin having a maximum glass transition temperature ranging from 90° C. to 120° C. according to JIS K 7121, and an infrared transmissible coloring agent, and has a thickness ranging from 10 to 300 μm, that the second resin layer is a white-based resin layer which comprises a rubber containing aromatic vinyl-based resin having a maximum glass transition temperature ranging from 90° C. to 120° C. according to JIS K 7121, and a white-based coloring agent, and has a thickness ranging from 10 to 300 μm, and that the third resin layer is a resin layer which comprises a saturated polyester resin and has a thickness ranging from 10 to 300 μm, and is a resin layer consisting of a film having a ratio of dimension change between before and after the film is left to stand still at a temperature of 135° C. for 30 minutes of ±0.5% or less.
2. The backside protective film for solar cell according to 1 above, wherein the third resin layer is formed using a heat-treated product of a film containing the saturated polyester resin.
3. The backside protective film for solar cell according to 1 or 2 above, wherein the third resin layer comprises a white-based coloring agent.
4. The backside protective film for solar cell according to any one of 1 to 3 above, wherein the backside protective film has an absorbance of a light having a wavelength of 400 to 700 nm of 60% or higher when the light is irradiated to a surface of the first resin layer of the backside protective film for solar cell.
5. The backside protective film for solar cell according to any one of 1 to 4 above, wherein the backside protective film has a reflectance to a light having a wavelength of 800 to 1,400 nm of 50% or higher when the light is irradiated to a surface of the first resin layer of the backside protective film for solar cell.
6. The backside protective film for solar cell according to any one of 1 to 5 above, further comprising a water vapor barrier layer between the first resin layer and the second resin layer, or between the second resin layer and the third resin layer.

7. The backside protective film for solar cell according to 6 above, wherein the water vapor barrier layer is consisting of a vapor deposited film in which a layer of a metal and/or a metal oxide is formed thereon.

8. The backside protective film for solar cell according to any one of 1 to 7 above, wherein a thickness of the backside protective film for solar cell is in the range from 30 to 600 μm.

9. A production method of the backside protective film for solar cell according to 1 above, comprising:

a process in which a film containing a saturated polyester resin is heated at a temperature ranging from 100° C. to 150° C. in the atmospheric air, to turn the film into a third film having a ratio of dimension change between before and after the film is left to stand still at a temperature of 135° C. for 30 minutes of ±0.5% or less; and a process in which a first film containing the rubber containing aromatic vinyl-based resin and the infrared transmissible coloring agent, a second film containing the rubber containing aromatic vinyl-based resin and the white-based coloring agent, and the third film are joined to one another.

10. A solar cell module, characterized by comprising the backside protective film for solar cell according to any one of 1 to 8 above.

Effect of the Invention

The backside protective film for solar cell of the present invention is low in heat storage upon receipt of a light such as solar light onto a surface of the first resin layer, is excellent in heat resistance suppressing thermal deformation, is excellent in durability to a thermal cycle, adhesiveness to a member including an ethylene vinyl acetate copolymer, flexibility and scratch resistance, and is favorable in processability and workability. In addition, since the second resin layer is a white-based resin layer, the backside protective film for solar cell of the present invention enables to reflect a solar light or the like transmitted through the first resin layer by the second resin layer when the light is caused to enter the protective film from the first resin layer side. Further, when the surface of the first resin layer is adhered to a filling unit that contains an ethylene vinyl acetate copolymer composition for filling gaps among the solar cell element and the first resin layer and that has solar cell elements embedded therein to thereby establish a solar cell module, it is enabled to improve a photoelectric conversion efficiency by virtue of the reflected light.

In the case where the third resin layer further contains a white-based coloring agent, both the second resin layer and third resin layer are white-based resin layers, thereby enabling to reflect a solar light or the like transmitted through the first resin layer by the second resin layer and third resin layer when the light is caused to enter the protective film from the first resin layer side, in a manner to provide a further improved degree of reflection of the light back to the first resin layer side.

In the case where the backside protective film has an absorbance of a light having a wavelength of 400 to 700 nm of 60% or higher when the light is irradiated to a surface of the first resin layer of the backside protective film for solar cell, a solar cell module having an excellent dark-colored external appearance by virtue of the infrared transmissible coloring agent contained in the first resin layer can be provided. When the solar cell module having the sheet is arranged on a roof of a house or the like, excellent external appearance, design and the like can be obtained.

In the case where the backside protective film has a reflectance to a light having a wavelength of 800 to 1,400 nm of 50% or higher when the light is irradiated to a surface of the first resin layer of the backside protective film for solar cell, heat storage in the backside protective film for solar cell is restricted when the solar light transmits through a filling unit and leaks through gaps among adjacent solar cell elements toward the backside protective film for solar cell. And the reflected light is supplied to the back surfaces of the solar cell elements to improve a power generation efficiency.

In the case where a water vapor barrier layer is provided between the first resin layer and the second resin layer, and/or between the second resin layer and the third resin layer, the backside protective film for solar cell is excellent in water vapor barrier property at both surfaces of the first and third resin layer sides.

In the case where the water vapor barrier layer is consisting of a vapor deposited film in which a layer of a metal and/or a metal oxide is formed thereon, water vapor barrier property is excellent without deteriorating a balance between flexibility and heat resistance (dimension stability).

In the case where the thickness of the backside protective film for solar cell of the present invention is in the range from 30 to 600 μm, flexibility is excellent.

According to the production method of a backside protective film for solar cell of the present invention, it is enabled to produce a laminated film having a specific configuration and a specific performance with a good efficiency.

The solar cell module of the present invention is suitable for outdoor usage where the backside protective film is exposed to sunlight, wind and rain, and the like over a long period of time and leads to a power generation efficiency because the solar cell module has the present backside protective film for solar cell.

DESCRIPTION OF THE PREFERRED EMBODIMENTS

Hereinafter, the present invention will be described in greater detail. In the present specification, "(co)polymer (ize)" means homopolymer(ize) and copolymer(ize), "(meth) acryl" means acryl and methacryl, and "(meth)acrylate" means acrylate and methacrylate.

Figure 1:
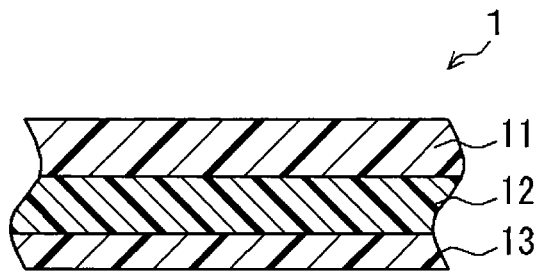
FIG. 1 is a schematic cross-sectional view of an embodiment of a backside protective film for solar cell.
Figure 2:
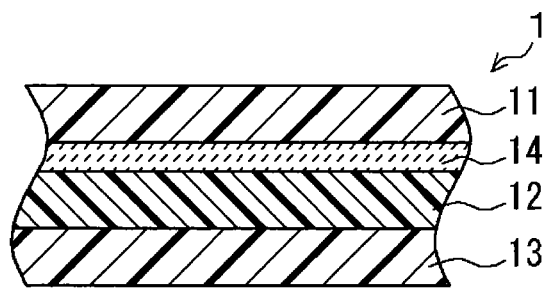
FIG. 2 is a schematic cross-sectional view of another embodiment of a backside protective film for solar cell.
Figure 3:
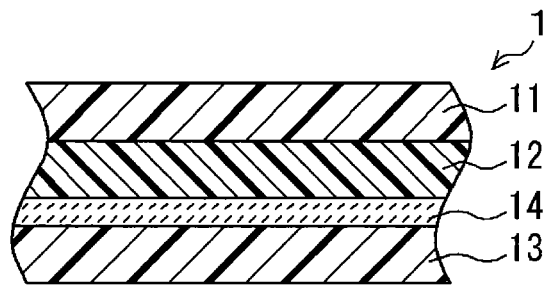
FIG. 3 is a schematic cross-sectional view of a further embodiment of a backside protective film for solar cell.
Figure 4:
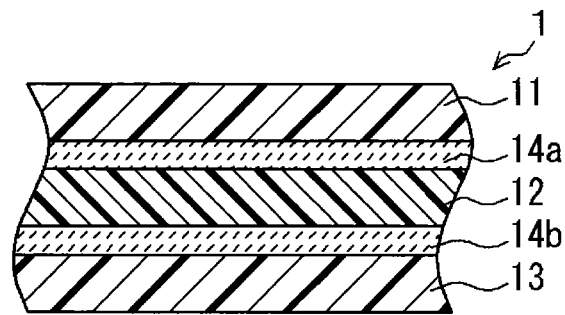
FIG. 4 is a schematic cross-sectional view of still another embodiment of a backside protective film for solar cell.

The backside protective film for solar cell of the present invention is a laminated film sequentially including a first resin layer, a second resin layer, and a third resin layer, and FIG. 1 shows a schematic cross-sectional view thereof. Namely, the backside protective film for solar cell 1 of FIG. 1 is a laminated film sequentially including a first resin layer 11, a second resin layer 12, and a third resin layer 13. Further, FIG. 2, FIG. 3, and FIG. 4 illustrate schematic cross-sectional views of such back surface protective films in cases that laminated films include a water vapor barrier layer between the first resin layer and the second resin layer, and/or between the second resin layer and the third resin layer, respectively, in the present invention. The backside protective film for solar cell 1 of FIG. 2 is a laminated film sequentially including a first resin layer 11, a water vapor barrier layer 14, a second resin layer 12, and a third resin layer 13. The backside protective film for solar cell 1 of FIG. 3 is a laminated film sequentially including a first resin layer 11, a second resin layer 12, a water vapor barrier layer 14, and a third resin layer 13. The backside protective film for solar cell 1 of FIG. 4 is a laminated film sequentially including a first resin layer 11, a water vapor barrier layer 14a, a second resin layer 12, a water vapor barrier layer 14b, and a third resin layer 13.

The first resin layer is an infrared transmissible colored resin layer which contains an infrared transmissible coloring agent and a rubber containing aromatic vinyl-based resin having a highest glass transition temperature according to JIS K 7121 (hereinafter referred to as "Tg") of between 90° C. and 120° C. and the resin layer acts as a layer for mainly absorbing visible light and transmitting infrared light therethrough. Further, since the first resin layer contains at least the rubber containing aromatic vinyl-based resin, the first resin layer is excellent in adhesiveness to a filling unit that contains an ethylene vinyl acetate copolymer composition or the like and that has solar cell elements embedded therein.

The rubber containing aromatic vinyl-based resin is a resin at least containing a rubber reinforced aromatic vinyl-based resin (hereinafter referred to as "resin (A1)") obtained by polymerizing a vinyl-based monomer containing an aromatic vinyl compound and a cyanidated vinyl compound in the presence of a rubbery polymer, and may be a resin consisting of this resin (A1) and a copolymer (hereinafter referred to as "copolymer (A2)") containing a structural unit(s) derived from the aromatic vinyl compound and structural unit(s) derived from the cyanidated vinyl compound.

The content of the rubbery polymer in the rubber containing aromatic vinyl-based resin is contained at preferably 5% to 40% by mass, more preferably 8% to 30% by mass, further preferably 10% to 20%, and particularly 12% to 18% by mass from viewpoints of impact resistance and heat resistance of a molded article.

Hereinafter, the composition constituting the first resin layer will be explained as a first thermoplastic resin composition. Namely, this first thermoplastic resin composition is a composition which includes the rubber containing aromatic vinyl-based resin and the infrared transmissible coloring agent, and may include, as required, other resin or polymer (hereinafter collectively referred to as "additional resin") and additives to be described later.

The rubber containing aromatic vinyl-based resin consists of the resin (A1), or the combination of the resin (A1) and copolymer (A2), as described above. The resin (A1) and copolymer (A2) may each contain one kind of resin/copolymer or two or more kinds of resins/copolymers. When all resins (A1) or a mixture consisting of all resins (A1) and all copolymers (A2) is subjected to a thermal analysis using a differential scanning calorimeter or the like in conformity to JIS K 7121, Tg can be obtained. The highest glass transition temperature is in the range from 90° C. to 120° C., and preferably from 92° C. to 118° C. Highest temperatures among Tg's in the above range lead to a backside protective film for solar cell which is excellent not only in adhesiveness to a filling unit having solar cell elements embedded therein, but also in durability such that a solar cell is restricted in deformation and the like even when the solar cell is used over a long period of time in an environment exhibiting a considerable temperature difference between a hot condition and a cold condition, for example. Highest temperatures higher than 120° C. lead to a backside protective film for solar cell which is insufficient in durability in thermal cycle. In turn, highest temperatures lower than 90° C. lead to a backside protective film for solar cell which is insufficient in heat resistance. These natures according to the rubber containing aromatic vinyl-based resin are important, in combination with the configurations in the second resin layer and the third resin layer. It is noted that the "durability in thermal cycle" means that no cracks are caused or crack lengths are less than 1 mm even when cracks are caused as a result that the applicable backside protective film for solar cell is subjected to a thermal cycle test as will be described in Examples.

It is noted that the rubber containing aromatic vinyl-based resin having the highest temperature among Tg's may be so configured that: all the resins (A1) and copolymers (A2) contained therein each independently have a Tg between 90° C. and 120° C.; or the rubber containing aromatic vinyl-based resin may contain resins or polymers each having a Tg lower than 90° C. or higher than 120° C. when measured independently, insofar as the rubber containing aromatic vinyl-based resin as a whole has a highest temperature between 90° C. and 120° C. among Tg's.

The resin (A1) is a rubber reinforced aromatic vinyl-based resin obtained by polymerizing a vinyl-based monomer (hereinafter referred to as "vinyl-based monomer (a1-2)") containing an aromatic vinyl compound and a cyanidated vinyl compound in the presence of a rubbery polymer (hereinafter referred to as "rubbery polymer (a1-1)"). The resin (A1) generally contains: a copolymerized resin where the vinyl-based monomer (a1-2) containing the aromatic vinyl compound and cyanidated vinyl compound is graft copolymerized with the rubbery polymer (a1-1); and an ungrafted component where the vinyl-based monomer is not grafted to the rubbery polymer (a1-1), i.e., a (co)polymer derived from the remaining vinyl-based monomer (a1-2).

The rubbery polymer (a1-1) used for the formation of the resin (A1) is not particularly limited so long as it is rubbery at room temperature. The polymer may be a homopolymer or a copolymer. In addition, this rubbery polymer (a1-1) may be a crosslinked polymer or a non-crosslinked polymer.

The rubbery polymer (a1-1) is not particularly limited and example thereof includes a conjugated diene-based rubber, a hydrogenated conjugated diene-based rubber, an ethylene α-olefin-based copolymeric rubber, an acrylic rubber, a silicone rubber, a silicone-acryl composite rubber, and the like. These rubbers may be used singly or in combination of two or more types thereof.

Among these, an acrylic rubber, silicone rubber, silicone-acryl composite rubber, ethylene α-olefin-based copolymeric rubber, and hydrogenated conjugated diene-based rubber are preferable from a viewpoint of weather resistance.

The rubbery polymer (a1-1) is not particularly limited in shape, and may be in a particulate shape (spherical shape, or substantially spherical shape), linear shape, curved shape, or the like. In the case of a particulate shape, its volume average particle size is preferably in the range from 5 to 2,000 nm, more preferably in the range from 10 to 1,800 nm, and further preferably in the range from 50 to 1,500 nm. Volume average particle size within the above range leads to an improved processability of the first thermoplastic resin composition, an excellent impact resistance of first resin layer to be obtained therefrom, and the like. The volume average particle size can be measured by an image analyzing method utilizing an electron photomicrograph, a laser diffraction method, a light scattering method, and the like.

Examples of the conjugated diene-based rubber include a polybutadiene, a butadiene styrene random copolymer, a butadiene styrene block copolymer, a butadiene acrylonitrile copolymer, and the like. These polymers may be used singly or in combination of two or more types thereof.

In the present invention, the conjugated diene-based rubber is to preferably have a glass transition temperature of –20° C. or lower, from viewpoints of flexibility, low-temperature impact resistance, and the like.

The acrylic rubber is preferably a (co)polymer containing a structural unit derived from an alkyl acrylate having an alkyl group with 2 to 8 carbon atoms, in an amount of 80% or more by mass, based on the total amount of structural units constituting the acrylic rubber.

Examples of the alkyl acrylate having an alkyl group with 2 to 8 carbon atoms include ethyl acrylate, propyl acrylate, n-butyl acrylate, isobutyl acrylate, hexyl acrylate, n-octyl acrylate, 2-ethylhexyl acrylate, and the like. These compounds may be used singly or in combination of two or more types thereof. Preferable alkyl acrylates are n-butyl acrylate, isobutyl acrylate and 2-ethylhexyl acrylate.

When the acrylic rubber contains structural units derived from other monomers, examples of the other monomers include: a monofunctional monomer such as vinyl chloride, vinylidene chloride, acrylonitrile, a vinyl ester, a methacrylic acid alkyl ester, (meth)acrylic acid and styrene; a crosslinkable monomer such as a mono- or poly-ethylene glycol di(meth)acrylate including ethylene glycol di(meth)acrylate, diethylene glycol di(meth)acrylate, triethylene glycol di(meth)acrylate, and tetraethylene glycol di(meth)acrylate, divinyl benzene, a di- or tri-allyl compound including diallyl phthalate, diallyl maleate, diallyl succinate, and triallyl triazine, an allyl compound such as allyl(meth)acrylate, a conjugated diene-based compound such as 1,3-butadiene; and the like.

The acrylic rubber is to preferably have a Tg of –10° C. or lower, from viewpoints of flexibility, low-temperature impact resistance, and the like. The acrylic rubber having the above Tg is typically a copolymer containing a structural unit derived from the above-mentioned crosslinkable monomer.

The content of a structural unit deriving from a crosslinkable monomer constituting the preferable acrylic rubber is preferably in the range from 0.01% to 10% by mass, more preferably from 0.05% to 8% by mass, and further preferably from 0.1% to 5% by mass, based on the total amount of structural units.

The volume average particle size of the acrylic rubber is preferably in the range from 5 to 500 nm, more preferably from 10 to 450 nm, and further preferably from 20 to 400 nm, from viewpoints of flexibility, low-temperature impact resistance and the like.

The acrylic rubber can be produced by known methods and preferable production method is an emulsion polymerization method.

Preferable as the silicone rubber is a rubber which is contained in a latex, so as to facilitate emulsion polymerization as a preferable method for the production of the rubber reinforced aromatic vinyl-based resin. Thus, this silicone rubber may be a polyorganosiloxane-based rubber manufactured by methods described, for example, in U.S. Pat. No. 2,891,920, U.S. Pat. No. 3,294,725 or the like, and the like.

The polyorganosiloxane-based rubber is preferably a silicone rubber which is contained in a latex manufactured by a method configured to shearingly mix an organosiloxane with water using a homomixer or ultrasonic mixer in the presence of a sulfonic acid-based emulsifier such as an alkylbenzenesulfonic acid and an alkylsulfonic acid, followed by condensation, for example. The alkylbenzenesulfonic acid is preferable in that the same acts as an emulsifier for the organosiloxane, and also as a polymerization initiator. At this time, combiningly using a metal alkylbenzenesulfonate, a metal alkylsulfonate, or the like, preferably exhibits an effect to stably maintain the silicone rubber upon production of the rubber reinforced aromatic vinyl-based resin. The polyorganosiloxane-based rubber may have an end capped by a hydroxyl group, alkoxy group, trimethylsilyl group, methyldiphenylsilyl group, or the like. Further, it is possible to cocondense a graft crossing agent and/or crosslinking agent as required, to the extent that the performance intended by the present invention is not deteriorated. Using them enables to improve the impact resistance.

The organosiloxane to be used for the above reaction is a compound having a structural unit represented by, for example, the following general formula:

(in the formula, $R^1$ is a substituted or unsubstituted monovalent hydrocarbon group, and m indicates an integer of 0 to 3).

The compound has a straight, branched, or cyclic structure, and is preferably an organosiloxane having a cyclic structure. Examples of the $R^1$, i.e., the monovalent hydrocarbon group, possessed by this organosiloxane, include: an alkyl group such as methyl group, ethyl group, propyl group and butyl group; an aryl group such as phenyl group and tolyl group; an alkenyl group such as vinyl group and allyl group; a group obtained by substituting a part of hydrogen atoms bonded to a carbon atom(s) in each of these hydrocarbon groups, with a halogen atom, cyano group or the like; a group obtained by substituting at least one of hydrogen atoms in the alkyl group, with a mercapto group; and the like.

A straight or branched organosiloxane can be used as the organosiloxane in addition to the cyclic compound such as hexamethyl cyclotrisiloxane, octamethyl cyclotetrasiloxane, decamethyl cyclopentasiloxane, dodecamethyl cyclohexasiloxane, trimethyl triphenylcyclotrisiloxane, tetramethyl tetraphenylcyclotetrasiloxane, and octaphenyl cyclotetrasiloxane. These compounds may be used singly or in combination of two or more types thereof.

It is noted that the organosiloxane may be a previously condensed polyorganosiloxane having Mw of about 500 to 10,000, for example. Further, when the organosiloxane is a polyorganosiloxane, its molecular chain end may be capped by a hydroxyl group, alkoxy group, trimethylsilyl group, methyldiphenylsilyl group, or the like.

The graft crossing agent is typically a compound having a carbon-carbon unsaturated bond and an alkoxysilyl group, and an example thereof includes p-vinylphenylmethyldimethoxysilane, 2-(p-vinylphenyl)ethylmethyldimethoxysilane, 3-(p-vinylbenzoyloxy)propylmethyldimethoxysilane, and the like.

The amount of the graft crossing agent to be used is usually 10 parts or less by mass, preferably in the range from 0.2 to 10 parts by mass, and more preferably from 0.5 to 5 parts by mass, based on 100 parts by mass of the total amount of the organosiloxane, graft crossing agent, and crosslinking agent. If an excessively large amount of the graft crossing agent is used, the molecular weight of a resulting graft copolymer may be lower, thereby failing to obtain sufficient impact resistance. This is also apt to progress an oxidative degradation from a double bond of a polyorganosiloxane-based rubber after grafting, thereby occasionally failing to obtain a rubber reinforced aromatic vinyl-based resin (A1) having an excellent weather resistance.

Examples of the crosslinking agent include a trifunctional crosslinking agent such as methyltrimethoxysilane, ethyltrimethoxysilane, phenyltrimethoxysilane, and ethyltriethoxysilane; a tetrafunctional crosslinking agent such as tetraethoxysilane; and the like. It is possible to adopt a crosslinkable prepolymer to be obtained by previously condensation polymerization of these compounds. These crosslinking agents may be used singly or in combination of two or more types thereof.

The amount of the crosslinking agent to be used is typically 10 parts or less by mass, preferably 5 parts or less by mass, and more preferably in the range from 0.01 to 5 parts by mass, based on 100 parts by mass of the total amount of the organosiloxane, graft crossing agent, and crosslinking agent. If an excessively large amount of the crosslinking agent is used, the resiliency of a resulting polyorganosiloxane-based rubber may be lost, thereby deteriorating flexibility of the backside protective film.

The volume average particle size of the silicone rubber is usually in the range from 5 to 500 nm, preferably form 10 to 400 nm, and further preferably from 50 to 400 nm. This volume average particle size can be readily controlled, by means of amounts of an emulsifier and water to be used upon production, a degree of dispersion upon mixing by a homomixer or ultrasonic mixer, or a charging method of the organosiloxane. If the volume average particle size is exceeding 500 nm, the appearance may be deteriorated, such as gloss deterioration.

The silicone-acryl composite rubber is a rubbery polymer containing a polyorganosiloxane-based rubber and a polyalkyl(meth)acrylic rubber. The preferable silicone-acryl composite rubber is a composite rubber having a structure where the polyorganosiloxane-based rubber and the polyalkyl(meth)acrylic rubber are mutually entwined such that they are not separable from each other.

Preferably usable as the polyorganosiloxane-based rubber is a rubber obtained by copolymerization of an organosiloxane. Examples of the organosiloxane include various reduced forms of three or more-membered rings, and preferable example thereof includes hexamethyl cyclotrisiloxane, octamethyl cyclotetrasiloxane, decamethyl cyclopentasiloxane, dodecamethyl cyclohexasiloxane, trimethyltriphenyl cyclotorisiloxane, tetramethyltetraphenyl cyclotetrasiloxane, octaphenyl cyclotetrasiloxane, and the like. These organosiloxanes may be used singly or in combination of two or more types thereof.

The content of the structural unit derived from the organosiloxane constituting the polyorganosiloxane-based rubber is preferably 50% or more by mass, and more preferably 70% or more by mass based on the total amount of structural units.

Examples of the polyalkyl(meth)acrylic rubber include a rubber obtained by (co)polymerization of a monomer containing a (meth)acrylic acid alkyl ester compound such as methyl acrylate, ethyl acrylate, n-propyl acrylate, n-butyl acrylate, 2-ethylhexyl acrylate, ethoxyethoxyethyl acrylate, methoxytripropyleneglycol acrylate, 4-hydroxybutyl acrylate, lauryl methacrylate, and stearyl methacrylate. These (meth)acrylic acid alkyl ester compounds may be used singly or in combination of two or more types thereof.

The monomer may contain various vinyl-based monomer including an aromatic vinyl compound such as styrene, α-methyl styrene and vinyl toluene; a cyanidated vinyl compound such as acrylonitrile and methacrylonitrile; a methacryl-modified silicone; and a fluorine-based vinyl compound in an amount of 30% or less by mass as a copolymeric component, in addition to the (meth)acrylic acid alkyl ester compound.

The polyalkyl(meth)acrylic rubber is preferably of a copolymer having two or more Tg's since the rubber is to be capable of providing the backside protective film with a sufficient flexibility.

The silicone-acryl composite rubber may be used which is produced by the methods described, for example, in JP-A H4-239010, JP-A H4-100812, and the like.

The volume average particle size of the silicone-acryl composite rubber is preferably in the range from 5 to 500 nm, more preferably from 10 to 450 nm, and further preferably from 20 to 400 nm, from viewpoints of flexibility, low-temperature impact resistance and the like.

The ethylene α-olefin-based copolymeric rubber is a copolymer containing an ethylene unit and a structural unit formed from an α-olefin having 3 or more carbon atoms. Example thereof includes an ethylene α-olefin copolymer, an ethylene α-olefin non-conjugated diene copolymer, and the like.

Examples of the ethylene α-olefin copolymer include ethylene propylene copolymer, ethylene butene-1 copolymer, and the like. In addition, examples of the ethylene α-olefin non-conjugated diene copolymer include ethylene propylene non-conjugated diene copolymer ethylene butene-1 non-conjugated diene copolymer, and the like.

The α-olefin is preferably an α-olefin having 3 to 20 carbon atoms, and specific example thereof includes propylene, 1-butene, 1-pentene, 1-hexene, 4-methyl-1-pentene, 1-heptene, 1-octene, 1-decene, 1-hexadecene, 1-eicocene, and the like. In the α-olefin, preferable number of carbon atom is 3 to 12, and the more preferable is 3 to 8.

Content ratio of the ethylene unit and α-olefin unit constituting the ethylene α-olefin-based copolymeric rubber are preferably from 5% to 95% by mass and from 5% to 95% by mass, more preferably from 50% to 90% by mass and from 10% to 50% by mass, further preferably from 60% to 88% by mass and from 12% to 40% by mass, and particularly from 70% to 85% by mass and from 15% to 30% by mass, respectively, based on 100% by mass of the total amount of these units. If the content of the α-olefin unit is too much, flexibility may be deteriorated.

In the case where the ethylene α-olefin-based copolymeric rubber is an ethylene α-olefin non-conjugated diene copolymer, examples of the non-conjugated diene include an alkenyl norbornene such as 5-ethylidene-2-norbornene; a cyclic diene such as dicyclopentadiene; an aliphatic diene; and the like. These compounds may be used singly or in combination of two or more types thereof.

The content of the structural unit derived from the non-conjugated diene is preferably in the range from 1% to 30% by mass, and more preferably from 2% to 20% by mass, based on the total amount of the structural units constituting the ethylene α-olefin non-conjugated diene copolymer. If the content of the non-conjugated diene unit is too much, the appearance and weather resistance may be deteriorated.

The content of an unsaturated group in the ethylene α-olefin-based copolymer rubber is preferably in the range from 4 to 40, in terms of an iodine value.

Further, Mooney viscosity ($ML_{1+4}$, at a temperature of 100° C.; according to JIS K6300) of the ethylene α-olefin-based copolymer rubber is preferably in the range from 5 to 80, more preferably from 10 to 65, and further preferably from 15 to 45. If the Mooney viscosity is in the above range, impact resistance and flexibility are excellent.

The hydrogenated conjugated diene-based rubber is not particularly limited so long as it is a (co)polymer obtained by hydrogenating a (co)polymer containing a structural unit derived from a conjugated diene-based compound.

Examples of the hydrogenated conjugated diene-based rubber include a hydrogenated product of a conjugated diene block copolymer having the following structure. Namely, the copolymer is a block copolymer in which two or more types of polymer blocks are in combination, among a polymer block A consisting of a structural unit derived from an aromatic vinyl compound, a polymer block B obtained by hydrogenating 95% or more by mol of double bond moieties of a polymer containing a structural unit derived from a conjugated diene-based compound and containing a 1,2-vinyl bond of exceeding 25% by mol, a polymer block C obtained by hydrogenating 95% or more by mol of double bond moieties of a polymer containing a structural unit derived from a conjugated diene-based compound and containing a 1,2-vinyl bond of 25% or less by mol, and a polymer block D obtained by hydrogenating 95% or more by mol of double bond moieties of a polymer consisting of a structural unit derived from an aromatic vinyl compound and a structural unit derived from a conjugated diene-based compound.

The molecular structure of the block copolymer may be branched, radial, or a combination thereof. Further, the block structure may be a diblock, triblock, multi-block, or a combination thereof.

Examples of the structure of the block copolymer include A-(B-A)n, (A-B)n, A-(B-C)n, C-(B-C)n, (B-C)n, A-(D-A)n, (A-D)n, A-(D-C)n, C-(D-C)n, (D-C)n, A-(B-C-D)n, (A-B-C-D)n, and the like [n is an integer of 1 or greater], and preferable examples are A-B-A, A-B-A-B, A-B-C, A-D-C, and C-B-C.

The aromatic vinyl compound used for the formation of the polymer blocks A and D, constituting the block copolymer is not particularly limited so long as it is a compound having at least one vinyl bond and at least one aromatic ring. Examples thereof include styrene, α-methyl styrene, methyl styrene, vinyl xylene, monochlorostyrene, dichlorostyrene, monobromostyrene, dibromostyrene, fluorostyrene, p-tert-butyl styrene, ethyl styrene, vinylnaphthalene, and the like. These compounds may be used singly or in combination of two or more types thereof. Among these, styrene is preferred.

The content of the polymer block A constituting the block copolymer is preferably in the range from 0% to 65% by mass, and more preferably from 10% to 40% by mass based on the entirety of the polymer. If the content of the polymer block A is too much, impact resistance may not be sufficient.

The polymer blocks B, C, and D are each formed by hydrogenating a block copolymer before hydrogenation obtained using a conjugated diene-based compound and an aromatic vinyl compound. Examples of the conjugated diene-based compound used for the formation of the polymer blocks B, C and D include 1,3-butadiene, isoprene, 1,3-pentadiene, chloroprene, and the like. These compounds may be used singly or in combination of two or more types thereof. Among them, 1,3-butadiene and isoprene are preferable since it is industrially utilizable and is excellent in physical properties.

Each hydrogenation rate for the polymer blocks B, C and D is 95% or more by mol and preferably 96% or more by mol.

The content of the 1,2-vinyl bond in the polymer block B is preferably exceeding 25% by mol and 90% or less by mol, and more preferably in the range from 30% to 80% by mol. If the content of the 1,2-vinyl bond is 25% or less by mol, rubbery properties may be lost and impact resistance may not be sufficient. On the other hand, if the content is exceeding 90% by mol, chemical resistance may not be sufficient.

In addition, the content of the 1,2-vinyl bond in the polymer block C is preferably 25% or less by mol, and more preferably 20% or less by mol.

The content of the 1,2-vinyl bond in the polymer block D is preferably in the range from 25% to 90% by mol, and more preferably from 30% to 80% by mol. If the 1,2-vinyl bond content is less than 25% by mol, rubbery property may be lost and impact resistance may not be sufficient. On the other hand, if the 1,2-vinyl bond content is exceeding 90% by mol, chemical resistance may not be sufficient.

Additionally, the content of the aromatic vinyl compound unit in the polymer block D is preferably 25% or less by mol, and more preferably 20% or less by mol. If the aromatic vinyl compound unit is exceeding 25% by mol, rubbery property may be lost and impact resistance may not be sufficient.

Examples of the hydrogenated conjugated diene-based monomer include a hydrogenated polybutadiene, a hydrogenated styrene butadiene rubber, a styrene ethylenebutylene olefin crystal block polymer, an olefin crystal ethylenebutylene olefin crystal block polymer, a styrene ethylenebutylene styrene block polymer, a hydrogenated butadiene acrylonitrile copolymer, and the like.

The weight average molecular weight (Mw) of the hydrogenated conjugated diene-based rubber is preferably in the range from 10,000 to 1,000,000, more preferably from 30,000 to 800,000, and further preferably from 50,000 to 500,000. When the Mw is in the above range, excellent flexibility may be obtained.

In the following, the vinyl-based monomer (a1-2) for the formation of the resin (A1) contains an aromatic vinyl compound and a cyanidated vinyl compound. That is to say, the vinyl-based monomer (a1-2) may be consisting of an aromatic vinyl compound and a cyanidated vinyl compound, or of an aromatic vinyl compound and a cyanidated vinyl compound and other monomer capable of copolymerizing with these compounds. Examples of the other monomers include a (meth)acrylic acid ester compound, a maleimide-based compound, an unsaturated acid anhydride, an unsaturated compound having a carboxyl group, an unsaturated compound having a hydroxyl group, an unsaturated compound having an epoxy group, an unsaturated compound having an oxazoline group, and the like. These monomers may be used singly or in combination of two or more thereof.

The aromatic vinyl compound is not particularly limited so long as it is a compound having at least one vinyl bond and at least one aromatic ring. An example thereof includes styrene, α-methyl styrene, o-methyl styrene, p-methyl styrene, β-methyl styrene, ethyl styrene, p-tert-butyl styrene, vinyl toluene, vinyl xylene, vinyl naphthalene, monochlorostyrene, dichlorostyrene, monobromostyrene, dibromostyrene, tribromostyrene, fluorostyrene and the like. These compounds may be used singly or in combination of two or more types thereof. In addition, styrene and α-methyl styrene are preferable among these. Particularly preferred is styrene.

Examples of the cyanidated vinyl compound include acrylonitrile, methacrylonitrile, ethacrylonitrile, α-ethyl acrylonitrile, α-isopropyl acrylonitrile, α-chloro acrylonitrile, α-fluoro acrylonitrile and the like. These compounds may be used singly or in combination of two or more types thereof. Among these, acrylonitrile is preferred.

Examples of the (meth)acrylic acid ester compound include methyl(meth)acrylate, ethyl(meth)acrylate, n-propyl (meth)acrylate, isopropyl(meth)acrylate, n-butyl(meth)acrylate, isobutyl(meth)acrylate, sec-butyl(meth)acrylate, tert-butyl(meth)acrylate, hexyl(meth)acrylate, n-octyl(meth) acrylate, 2-ethylhexyl(meth)acrylate, cyclohexyl(meth)

acrylate, phenyl(meth)acrylate, benzyl(meth)acrylate and the like. These compounds may be used singly or in combination of two or more types thereof.

Examples of the maleimide-based compound include maleimide, N-methyl maleimide, N-isopropyl maleimide, N-butyl maleimide, N-dodecyl maleimide, N-phenyl maleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, N-benzyl maleimide, N-(4-hydroxyphenyl)maleimide, N-naphthyl maleimide, N-cyclohexyl maleimide and the like. These compounds may be used singly or in combination of two or more types thereof. Another method for introducing a monomer unit deriving from the maleimide-based compound into the resin (A1) includes an imidization after copolymerization with maleic anhydride.

Examples of the unsaturated acid anhydride include maleic anhydride, itaconic anhydride, citraconic anhydride and the like. These compounds may be used singly or in combination of two or more types thereof.

Examples of the unsaturated compound having a carboxyl group include (meth)acrylic acid, ethacrylic acid, maleic acid, fumaric acid, itaconic acid, crotonic acid, cinnamic acid, and the like. These compounds may be used singly or in combination of two or more types thereof.

Examples of the unsaturated compound having a hydroxyl group include a (meth)acrylic acid ester having a hydroxyl group such as 2-hydroxymethyl(meth)acrylate, 2-hydroxyethyl(meth)acrylate, 3-hydroxypropyl(meth)acrylate, 2-hydroxybutyl(meth)acrylate, 3-hydroxybutyl(meth)acrylate, 4-hydroxybutyl(meth)acrylate, polyethylene glycol mono(meth)acrylate, polypropylene glycol mono(meth)acrylate, and a compound obtained by addition of ε-caprolacton to 2-hydroxymethyl(meth)acrylate; o-hydroxy styrene, m-hydroxy styrene, p-hydroxy styrene, o-hydroxy-α-methylstyrene, m-hydroxy-α-methylstyrene, p-hydroxy-α-methylstyrene, 2-hydroxymethyl-α-methylstyrene, 3-hydroxymethyl-α-methylstyrene, 4-hydroxymethyl-α-methylstyrene, 4-hydroxymethyl-1-vinyl naphthalene, 7-hydroxymethyl-1-vinyl naphthalene, 8-hydroxymethyl-1-vinyl naphthalene, 4-hydroxymethyl-1-isopropenyl naphthalene, 7-hydroxymethyl-1-isopropenyl naphthalene, 8-hydroxymethyl-1-isopropenyl naphthalene, p-vinylbenzyl alcohol, 3-hydroxy-1-propene, 4-hydroxy-1-butene, cis-4-hydroxy-2-butene, trans-4-hydroxy-2-butene, 3-hydroxy-2-methyl-1-propene, and the like. These compounds may be used singly or in combination of two or more types thereof.

Examples of the unsaturated compound having an epoxy group include glycidyl(meth)acrylate, 3,4-oxycyclohexyl(meth)acrylate, vinyl glycidyl ether, allyl glycidyl ether, methallyl glycidyl ether, and the like. These compounds may be used singly or in combination of two or more types thereof.

Examples of the unsaturated compound having an oxazoline group include vinyl oxazoline and the like.

In the present invention, the total amount of the aromatic vinyl compound and cyanidated vinyl compound in the vinyl-based monomer (a1-2) is preferably in the range from 70% to 100% by mass and more preferably from 80% to 100% by mass based on the total amount of the vinyl-based monomer (a1-2), from viewpoints of moldability, chemical resistance, hydrolysis resistance, dimension stability, external appearance and the like. Additionally, the ratio of the aromatic vinyl compound and cyanidated vinyl compound to be used are preferably from 5% to 95% by mass and from 5% to 95% by mass, more preferably from 50% to 95% by mass and from 5% to 50% by mass, and further preferably from 60% to 95% by mass and from 5% to 40% by mass, respectively, based on 100% by mass of the total amount of these monomers, from viewpoints of moldability, chemical resistance, hydrolysis resistance, dimension stability, external appearance and the like.

The preferable resins as the resin (A1) are as follows:
(1-1) a rubber reinforced aromatic vinyl-based resin obtained by polymerizing the vinyl-based monomer (a1-2) consisting of an aromatic vinyl compound and a cyanidated vinyl compound in the presence of the rubbery polymer (a1-1);
(1-2) a rubber reinforced aromatic vinyl-based resin obtained by polymerizing the vinyl-based monomer (a1-2) consisting of an aromatic vinyl compound, a cyanidated vinyl compound and a maleimide-based compound in the presence of the rubbery polymer (a1-1); and
(1-3) a rubber reinforced aromatic vinyl-based resin obtained by polymerizing the vinyl-based monomer (a1-2) consisting of an aromatic vinyl compound, a cyanidated vinyl compound and a (meth)acrylic acid ester compound in the presence of the rubbery polymer (a1-1).

The resin (A1) can be produced by polymerizing the vinyl-based monomer (a1-2) in the presence of the rubbery polymer (a1-1). The preferable polymerization method may be an emulsion polymerization, suspension polymerization, solution polymerization, bulk polymerization or a method combining any of two or more polymerization methods.

When the resin (A1) is produced, the reaction may be conducted by charging all of the vinyl-based monomer (a1-2) at once in the presence of the whole amount of the rubbery polymer (a1-1), or by charging the vinyl-based monomer (a1-2) dividedly or continuously. In addition, all of the vinyl-based monomer (a1-2) may be initiated in the presence of a part of the rubbery polymer (a1-1) or in the absence of the rubbery polymer (a1-1) for polymerization. The polymerization of the vinyl-based monomer (a1-2) may be initiated while charging dividedly or continuously. In this case, the rest of the rubbery polymer (a1-1) may be charged all at once, dividedly or continuously.

In the case of producing the resin (A1) by emulsion polymerization, a polymerization initiator, a chain-transfer agent (molecular weight adjuster), an emulsifier, water and the like are used.

Examples of the polymerization initiator include a redox-type initiator by combining an organic peroxide such as cumene hydroperoxide, diisopropylbenzene hydroperoxide and p menthane hydroperoxide, and a reducing agent such as sugar-containing pyrophosphoric acid formulation and sulfoxylate formulation; a persulfate such as potassium persulfate; a peroxide such as benzoyl peroxide (BPO), lauroyl peroxide, tert-butylperoxy laurate and tert-butylperoxy monocarbonate; and the like. These compounds may be used singly or in combination of two or more types thereof. The polymerization initiator is usually used in an amount from 0.1% to 1.5% by mass based on the total amount of the vinyl-based monomer (a1-2).

The polymerization initiator can be incorporated into the reaction system all at once or continuously.

Examples of the chain-transfer agent include a mercaptan such as octyl mercaptan, n-dodecyl mercaptan, tert-dodecyl mercaptan, n-hexyl mercaptan, n-hexadecyl mercaptan, n-tetradecyl mercaptan and tert-tetradecyl mercaptan; a terpinolene, α-methyl styrene dimer, and the like. These may be used singly or in combination of two or more types thereof. The chain-transfer agent is usually used in an amount from 0.05% to 2.0% by mass based on the total amount of the vinyl-based monomer (a1-2).

The chain-transfer agent can be incorporated into the reaction system all at once or continuously.

Examples of the emulsifier include an anionic surfactant and a nonionic surfactant. Examples of the anionic surfactant include a sulfuric acid ester of a higher alcohol, an alkyl benzene sulfonate including sodium dodecylbenzene sulfonate, an aliphatic sulfonate including sodium lauryl sulfonate, a higher aliphatic carboxylate, a phosphate-based compound, and the like. Examples of the nonionic surfactant include an alkyl ester type compound or alkyl ether type compound of a polyethylene glycol; and the like. These may be used singly or in combination of two or more types thereof. The emulsifier is used usually in an amount from 0.3% to 5.0% by mass based on the total amount of the vinyl-based monomer (a1-2).

The emulsion polymerization can be conducted in publicly known conditions according to the types of the vinyl-based monomer (a1-2), polymerization initiator and the like. A latex obtained by emulsion polymerization is usually subjected to solidification with a coagulant, the polymer component is pulverized, and then the product is purified by rinsing and drying. The coagulant may be used an inorganic salt such as calcium chloride, magnesium sulfate, magnesium chloride and sodium chloride; an inorganic acid such as sulfuric acid and hydrochloric acid; an organic acid such as acetic acid and lactic acid; and the like.

In the case of making two or more types of resins (A1) contain in the first thermoplastic resin composition, a method in which a resin (A1-a) obtained by coagulation of one latex and a resin (A1-b) obtained by coagulation of another latex are blended, and a method in which one latex and another latex are mixed and then the mixture is subjected to coagulation may be applied.

The production method for the resin (A1) by solution polymerization, bulk polymerization, and bulk-suspension polymerization may be applied to publicly known method.

Commercially products may be used as the resin (A1) having an embodiment such as a silicone rubber reinforced aromatic vinyl-based resin, or a silicone-acryl composite rubber reinforced aromatic vinyl-based resin. Examples of the resin (A1) obtained using a silicone-acryl composite rubber as the rubbery polymer (a1-1) include a commercially product "METABLEN SX-006" (trade name) manufactured by Mitsubishi Rayon Co., Ltd. according to the description in JP-A H4-239010.

The graft ratio of the resin (A1) is preferably in the range from 20% to 170%, more preferably from 30% to 170%, and particularly from 40% to 150%. If the graft ratio is too low, flexibility of the first resin layer may not be sufficient. On the other hand, if the graft ratio is too high, viscosity of the resin (A1) composition may be increased, and a production of a thin-walled article may be difficult when the first thermoplastic resin composition is used.

The graft ratio is obtainable by the following equation:

Graft ratio (%)=$\{(S-T)/T\} \times 100$

In the equation, S is a mass (g) of an insoluble component obtained by: adding 1 gram of the resin (A1) into 20 milliliters of acetone; shaking the mixture at a temperature of 25° C. for 2 hours by a shaker; and then subjecting the mixture to centrifugal separation at a temperature of 5° C. for 60 minutes with a centrifuge (rotational speed: 23,000 rpm), to separate the insoluble component from a soluble component; and T is a mass (g) of a rubbery polymer (a1-1) contained in 1 gram of the resin (A1). The mass of the rubbery polymer (a1-1) is obtainable by: a method for calculating it from a polymerization formulation and a polymerization conversion ratio; a method for obtaining it by an infrared absorption spectrum (IR); or the like.

The graft ratio can easily be controlled by varying types or amounts of the polymerization initiator, chain-transfer agent, emulsifier, solvent and the like, and by varying polymerization time, polymerization temperature and other conditions in producing the resin (A1).

The resin (A1) may be used singly or in combination of two or more types thereof.

The copolymer (A2) constituting the rubber containing aromatic vinyl-based resin together with the resin (A1) is a copolymer containing a structural unit derived from the aromatic vinyl compound (hereinafter referred to as "structural unit (sa-1)") and a structural unit derived from the cyanidated vinyl compound (hereinafter referred to as "structural unit (sa-2)"). This copolymer (A2) may be derived from an ungrafted copolymer based on the vinyl-based monomer (a1-2) generated upon production of the resin (A1), or may be derived from a copolymer separately obtained by polymerizing the vinyl-based monomer containing an aromatic vinyl compound and cyanidated vinyl compound.

The copolymer (A2) may consist of only the structural units (sa-1) and (sa-2), or may consist of the structural units (sa-1) and (sa-2) and a structural unit derived from an additional monomer copolymerizable with the aromatic vinyl compound and the cyanidated vinyl compound (hereinafter referred to as "structural unit (sa-3)"). Examples of the additional monomer include a (meth)acrylic acid ester compound, a maleimide-based compound, an unsaturated acid anhydride, an unsaturated compound having a carboxyl group, an unsaturated compound having a hydroxyl group, an unsaturated compound having an epoxy group, an unsaturated compound having an oxazoline group, and the like. These compounds may be ones exemplified in the description for the vinyl-based monomer (a1-2). The structural unit (sa-3) may be a structural unit derived from one kind of monomer, or may be a structural unit derived from two or more kinds of monomers. Further, the structural unit (sa-3) is preferably a structural unit derived from a maleimide-based compound, or the like.

The ratio of the total content of the structural units (sa-1) and (sa-2) in the copolymer (A2) is preferably in the range from 40% to 100% by mass, and more preferably from 50% to 100% by mass based on 100% by mass of the total of the structural units (sa-1), (sa-2) and (sa-3). In addition, the content ratio of the structural units (sa-1) and (sa-2) are preferably 5% to 95% by mass and 5% to 95% by mass, more preferably 40% to 95% by mass and 5% to 60% by mass, and further preferably 50% to 90% by mass and 10% to 50% by mass, respectively, based on 100% by mass of the total amount of these units, from viewpoints of moldability, chemical resistance, hydrolysis resistance, dimension stability, external appearance and the like.

When the copolymer (A2) contains the structural unit (sa-3) and this structural unit (sa-3) is a structural unit derived from a maleimide-based compound, it is possible to provide the first resin layer with heat resistance.

The preferable resins as the copolymer (A2) are as follows:
(1-5) a copolymer consisting of the structural units (sa-1) and (sa-2); and
(1-6) a copolymer consisting of the structural units (sa-1) and (sa-2) and a structural unit (hereinafter referred to as "structural unit (sa-3m)") derived from a maleimide-based compound.

When the copolymer (A2) is provided in the embodiment (1-5), the content ratio of the structural units (sa-1) and (sa-2) are preferably 5% to 95% by mass and 5% to 95% by mass, more preferably 40% to 95% by mass and 5% to 60% by mass, and further preferably 50% to 90% by mass and 10% to 50%, respectively, based on 100% by mass of the total amount of these structural units, from viewpoints of moldability, chemical resistance, hydrolysis resistance, dimension stability, external appearance and the like.

Examples of the copolymer in the embodiment (1-5) include a styrene acrylonitrile copolymer, an α-methyl styrene acrylonitrile copolymer, a styrene α-methyl styrene acrylonitrile copolymer, and the like.

When the copolymer (A2) is provided in the embodiment (1-6), the content ratio of the structural units (sa-1), (sa-2) and (sa-3m) are preferably 10% to 90% by mass, 9.5% to 70% by mass, and 0.5% to 30% by mass, more preferably 20% to 85% by mass, 14% to 60% by mass, and 1% to 20% by mass, and further preferably 30% to 80% by mass, 18% to 50% by mass, and 2% to 15% by mass, respectively, based on 100% by mass of the total amount of these structural units, from viewpoints of moldability, heat resistance, chemical resistance, hydrolysis resistance, dimension stability, flexibility and the like.

Examples of the copolymer in the embodiment (1-6) include a styrene acrylonitrile N-phenyl maleimide copolymer, and the like.

A styrene acrylonitrile methyl methacrylate copolymer or the like may be used as the copolymer (A2).

The copolymer (A2) can be produced by polymerizing a vinyl-based monomer containing an aromatic vinyl compound and a cyanidated vinyl compound (hereinafter referred to as "vinyl-based monomer (a2)"), in the presence or absence of a polymerization initiator. In the case of using the polymerization initiator, the polymerization method is preferably a solvent polymerization, bulk polymerization, emulsion polymerization, suspension polymerization and the like. These polymerizations may be combined. When the polymerization initiator is not used, thermal polymerization is usable.

The polymerization initiator to be used is one which is exemplified in the description of the production for the resin (A1), and the exemplified compound may be used singly or in combination of two or more types thereof. The amount of the polymerization initiator to be used is usually in the range from 0.1% to 1.5% by mass based on the total amount of the vinyl-based monomer (a2).

It is noted that a chain-transfer agent, emulsifier and the like that are exemplified in the description of the production for the resin (A1) may be used if necessary.

When the copolymer (A2) is produced, the polymerization may be initiated in a state that the total amount of the vinyl-based monomer (a2) is contained in a reaction system, or the polymerization may be conducted while charging an arbitrarily selected monomer component dividedly or continuously. Further, in the case of using a polymerization initiator, batch-wise or continuous addition into the reaction system is possible.

The copolymer (A2) may be used singly or in combination of two or more types thereof.

The intrinsic viscosity [η] (measured in methyl ethyl ketone at a temperature of 30° C.) of a component dissolved by acetone in the rubber containing aromatic vinyl-based resin is preferably in the range from 0.1 to 2.5 dl/g, more preferably from 0.2 to 1.5 dl/g, and further preferably from 0.25 to 1.2 dl/g. The intrinsic viscosity [η] having the above range leads to an excellent moldability of the first thermoplastic resin composition and an excellent thickness accuracy of the first resin layer.

Here, the intrinsic viscosity [η] can be obtained by the following procedure.

Namely, the acetone-soluble component collected after centrifugal separation upon obtaining the graft ratio in case of the resin (A1) is dissolved in methyl ethyl ketone to prepare five specimens having different concentrations; and reduced viscosities of the respective concentrations are measured at a temperature of 30° C. with Ubbelohde viscometer tube, thereby obtaining the intrinsic viscosity [η].

The intrinsic viscosity [η] can easily be controlled by varying types or amounts of the polymerization initiator, the chain-transfer agent, the emulsifier, the solvent and the like, and by varying polymerization time, polymerization temperature and other conditions in producing the resin (A1) and the copolymer (A2).

In addition, the intrinsic viscosity [η] can easily be controlled selecting appropriately a resin (A1) and copolymer (A2) in which intrinsic viscosities [η] are different from each other.

As mentioned above, the first thermoplastic resin composition may be consisting of the rubber containing aromatic vinyl-based resin or of the rubber containing aromatic vinyl-based resin and additional resin.

Examples of the additional resin include an acrylic resin having a structural unit derived from a (meth)acrylic acid ester compound; a saturated polyester resin such as a polyethylene terephthalate, polyethylene naphthalate and polybutylene terephthalate; a polyolefin resin; a poly vinyl chloride resin; a poly vinylidene chloride resin; a poly vinyl acetate resin; a polycarbonate resin; a fluorine resin; an ethylene vinyl acetate-based resin; and the like. These may be used singly or in combination of two or more types thereof.

When the first thermoplastic resin composition contains the additional resin, the content thereof is preferably less than 50% by mass, more preferably not more than 40% by mass, and further preferably not more than 30% by mass based on the rubber containing aromatic vinyl-based resin. If the content ratio of the additional resin is too high, the effect of the resin (A1) according to the present invention may be lowered.

The contents of the resin (A1) and copolymer (A2), as well as the additional resin to be used as required in the first thermoplastic resin composition are adjusted so that the content of the rubbery polymer (a1-1) derived from the resin (A1) is preferably made to be in the range from 5% to 40% by mass, more preferably from 8% to 30% by mass, further preferably from 10% to 20% by mass, and particularly from 12% to 18% by mass.

If the content of the rubbery polymer (a1-1) in the first thermoplastic resin composition exceeds 40% by mass, heat resistance may be insufficient. On the other hand, if the content thereof is less than 5% by mass, impact resistance may be insufficient.

The first thermoplastic resin composition contains an infrared transmissible coloring agent. This infrared transmissible coloring agent has a property acting to absorb a visible light therein and transmit an infrared light therethrough. The infrared transmissible coloring agent is usually in a color other than white, and is preferably a dark-colored compound colored in black, brown, dark blue, dark green, or the like.

Examples of the infrared transmissible coloring agent include a perylene-based pigment and the like. The following compounds represented by the general formulae (I) to (III) may be used as the perylene-based pigment.

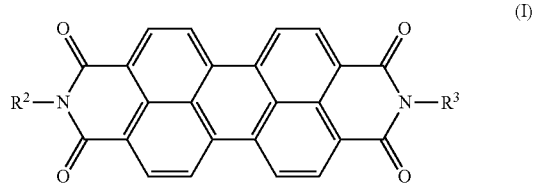

(In the formula, $R^2$ and $R^3$ may be the same or different from each other, and are butyl group, phenylethyl group, methoxyethyl group, or 4-methoxyphenylmethyl group.)

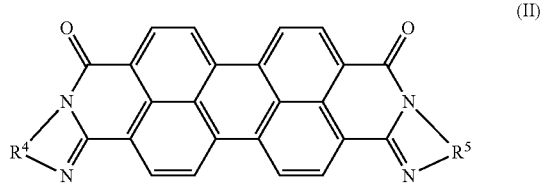

(In the formula, $R^4$ and $R^5$ may be the same or different from each other, and are phenylene group, 3-methoxyphenylene group, 4-methoxyphenylene group, 4-ethoxyphenylene group, an alkylphenylene group having 1-3 carbon atoms, hydroxyphenylene group, 4,6-dimethylphenylene group, 3,5-dimethylphenylene group, 3-chlorophenylene group, 4-chlorophenylene group, 5-chlorophenylene group, 3-bromophenylene group, 4-bromophenylene group, 5-bromophenylene group, 3-fluorophenylene group, 4-fluorophenylene group, 5-fluorophenylene group, naphhtylene group, naphthalene diyl group, pyridylene group, 2,3-pyridine diyl group, 4-methyl-2,3-pyridine diyl group, 5-methyl-2,3-pyridine diyl group, 6-methyl-2,3-pyridine diyl group, 5-methyl-3,4-pyridine diyl group, 4-methoxy-2,3-pyridine diyl group, or 4-chloro-2,3-pyridine diyl group.)

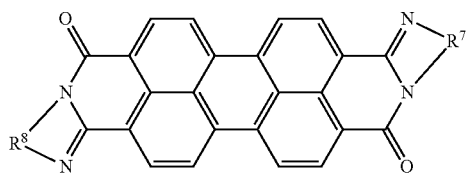

(In the formula, $R^6$ and $R^7$ may be the same or different from each other, and are phenylene group, 3-methoxyphenylene group, 4-methoxyphenylene group, 4-ethoxyphenylene group, an alkylphenylene group having 1-3 carbon atoms, hydroxyphenylene group, 4,6-dimethylphenylene group, 3,5-dimethylphenylene group, 3-chlorophenylene group, 4-chlorophenylene group, 5-chlorophenylene group, 3-bromophenylene group, 4-bromophenylene group, 5-bromophenylene group, 3-fluorophenylene group, 4-fluorophenylene group, 5-fluorophenylene group, naphhtylene group, naphthalene diyl group, pyridylene group, 2,3-pyridine diyl group, 4-methyl-2,3-pyridine diyl group, 5-methyl-2,3-pyridine diyl group, 6-methyl-2,3-pyridine diyl group, 5-methyl-3,4-pyridine diyl group, 4-methoxy-2,3-pyridine diyl group, or 4-chloro-2,3-pyridine diyl group.)

Commercially available products such as "Paliogen Black S 0084", "Paliogen Black L 0086", "Lumogen Black FK4280" and "Lumogen Black FK4281" which are all manufactured by BASF Corp. can be used as the perylene-based pigment.

The infrared transmissible coloring agent may be used singly or in combination of two or more types thereof.

The content of the infrared transmissible coloring agent in the first thermoplastic resin composition is preferably 10% or less by mass, more preferably in the range from 0.01% to 6% by mass, and further preferably from 0.05% to 5% by mass based on the first thermoplastic resin composition, from viewpoints of transmittivity of infrared light and absorptivity of the visible light.

In the present invention, the first thermoplastic resin composition may include other coloring agent depending on the purpose or application insofar as the other coloring agent does not lower the transmittivity of an infrared light at the first resin layer.

Examples of the other coloring agent include a cyan-based coloring agent (bluish coloring agent), a magenta-based coloring agent (reddish coloring agent), a yellow-based coloring agent (yellowish coloring agent), and the like.

For example, it is possible to use a yellowish pigment, a bluish pigment or the like as the other coloring agent based on the following combinations, thereby enabling to achieve articles provided with a backside protective film for solar cell which is colored variously:

(1) a brown coloring by combination of a black-based infrared transmissible coloring agent with a yellowish pigment; and (2) a perse coloring by combination of a black-based infrared transmissible coloring agent with a bluish pigment.

When the other coloring agent is used, the content thereof in the first thermoplastic resin composition is usually not more than 60 parts by mass, and preferably in the range from 0.01 to 55 parts by mass based on 100 parts by mass of the infrared transmissible coloring agent.

Carbon black is known to be a dark-colored coloring agent for absorbing light having a wavelength in an infrared region. In case that solar light is received at a surface of the first resin layer of a backside protective film for solar cell where the first resin layer is formed of a composition adopting carbon black instead of the infrared transmissible coloring agent, heat storage in this first resin layer is made to be considerably much. As such, in case of establishing a solar cell module in this embodiment by joining the surface of the backside protective film for solar cell at the first resin layer side to a filling unit that contains an ethylene vinyl acetate copolymer composition or the like and that has solar cell elements embedded therein, leakage of solar light into the first resin layer containing carbon black raises a temperature of the filling unit including the solar cell elements from the side of the backside protective film for solar cell having heat stored therein, thereby disadvantageously deteriorating a power generation efficiency. Thus, the present invention adopts such an embodiment that the first resin layer contains not carbon black but the infrared transmissible coloring agent, in a manner to maintain a lower heat storage, thereby allowing to overcome the above problem in an application of solar cell or the like.

The first thermoplastic resin composition may be one containing additives depending on the purpose or application. Examples of additives include an antioxidant, an ultraviolet absorber, an anti-aging agent, a plasticizer, a fluorescent brightening agent, a weather resisting agent, a filler, an antistatic agent, a flame retardant, an anti-fogging agent, an anti-bacterial agent, a fungicide, an anti-fouling agent, a tackifier, a silane coupling agent, and the like. Specific compounds and amounts for these additives will be described later.

The thickness of the first resin layer is in the range from 10 to 300 μm, preferably from 15 to 250 μm, and more preferably from 20 to 200 μm, from viewpoints of strength and flexibility of the backside protective film for solar cell of the present invention.

The second resin layer is a white-based resin layer which contains a white-based coloring agent and a rubber containing aromatic vinyl-based resin having a highest Tg of between 90° C. and 120° C. and the resin layer acts as a layer for mainly reflecting infrared light and visible light transmitted through the first resin layer, and having a function to maintain a balance of flexibility possessed by the backside protective film for solar cell of the present invention. Further, since this second resin layer contains the rubber containing aromatic vinyl-based resin, hydrolysis resistance, dimension stability, and impact resistance are excellent.

The rubber containing aromatic vinyl-based resin contained in the second resin layer may be the same as or different from the rubber containing aromatic vinyl-based resin (resin (A1), or combination of resin (A1) and copolymer (A2)), and the explanation (of the embodiment thereof and the production method therefor) is also applicable here.

Hereinafter, the composition constituting the second resin layer will be explained as a second thermoplastic resin composition. Namely, this second thermoplastic resin composition is a composition which includes the rubber containing aromatic vinyl-based resin and the white-based coloring agent, and may include, as required, an additional resin, additives, and the like in the same manner as the first resin layer.

The preferable resins as the resin (A1) contained in the second resin layer are as follows:
(2-1) a rubber reinforced aromatic vinyl-based resin obtained by polymerizing the vinyl-based monomer (a1-2) consisting of an aromatic vinyl compound and a cyanidated vinyl compound in the presence of the rubbery polymer (a1-1);
(2-2) a rubber reinforced aromatic vinyl-based resin obtained by polymerizing the vinyl-based monomer (a1-2) consisting of an aromatic vinyl compound, a cyanidated vinyl compound and a maleimide-based compound in the presence of the rubbery polymer (a1-1); and
(2-3) a rubber reinforced aromatic vinyl-based resin obtained by polymerizing the vinyl-based monomer (a1-2) consisting of an aromatic vinyl compound, a cyanidated vinyl compound and a (meth)acrylic acid ester compound in the presence of the rubbery polymer (a1-1).

Explanation for (1-1) to (1-3) in the first resin layer is applicable for the preferable configuration in these embodiments.

The resin (A1) may be used singly or in combination of two or more types thereof.

The preferable copolymers as the copolymer (A2) are as follows:
(2-5) a copolymer consisting of structural units (sa-1) and (sa-2); and
(2-6) a copolymer consisting of structural units (sa-1), (sa-2) and (sa-3m).

Explanation for (1-5) and (1-6) in the first resin layer is applicable for the preferable configuration in these embodiments. In particular, the content of the structural unit (sa-3m) ranging from 2% to 15% by mass in the embodiment (2-6) leads to durability to thermal cycle.

The copolymer (A2) may be used singly or in combination of two or more types thereof.

When the second thermoplastic resin composition contains the additional resin, the content thereof is preferably less than 50% by mass, more preferably not more than 40% by mass, and further preferably not more than 30% by mass based on the rubber containing aromatic vinyl-based resin. If the content ratio of the additional resin is too high, the effect of the resin (A1) according to the present invention may be lowered.

The second thermoplastic resin composition contains a white-based coloring agent. Examples of the white-based coloring agent include titanium oxide, zinc oxide, calcium carbonate, barium sulfate, calcium sulfate, alumina, silica, $2PbCO_3 \cdot Pb(OH)_2$, $[ZnS+BaSO_4]$, talc, gypsum, and the like. The white-based coloring agent may be used singly or in combination of two or more types thereof.

The content of the white-based coloring agent is preferably in the range from 1% to 45% by mass, more preferably from 3% to 40% by mass, and further preferably from 5% to 30% by mass with regard to the rubber containing aromatic vinyl-based resin from a viewpoint of reflectivity to a light having a wavelength of 800 to 1,400 nm. If the content of the white-based coloring agent is too much, flexibility of the backside protective film for solar cell of the present invention may be lowered.

The second resin layer is a white-based resin layer and has an L value (brightness) at the surface of a film consisting of the single layer of 60 or higher. More preferable L value is 65 or higher, and further preferably 70 or higher.

The second thermoplastic resin composition may contain other coloring agent such as yellowish coloring agent and bluish coloring agent in addition to the white-based coloring agent so long as the coloring agent maintains at least the above mentioned L value. When the other coloring agent is used, the content thereof is usually 10% or less by mass based on the second thermoplastic resin composition.

Specific examples and contents of additives in the case where the second thermoplastic resin composition contains the additives will be described later.

The thickness of the second resin layer is in the range from 10 to 300 μm, preferably from 15 to 250 μm, and more preferably from 20 to 200 μm. The thickness enables the backside protective film for solar cell of the present invention to maintain a highly balance of flexibility.

The third resin layer is a resin layer which contains a saturated polyester resin and is consisting of a film having a ratio of dimension change between before and after the film is left to stand still at a temperature of 135° C. for 30 minutes (hereinafter referred to as "dimension change ratio") of ±0.5% or less, preferably of ±0.4% or less, and more preferably of ±0.3% or less. This third resin layer is a layer for mainly providing the film with durability. Namely, in the backside protective film for solar cell provided with the third resin layer having such a nature, thermal deformation due to usage of the solar cell is restricted to achieve an excellent heat resistance. In the case where the third resin layer contains a white-based coloring agent, it is enabled to reflect the light transmitted through the first resin layer and second resin layer back to the first resin layer side.

Hereinafter, the composition constituting the third resin layer will be explained as a third thermoplastic resin composition. Namely, this third thermoplastic resin composition is a composition wherein a film containing this composition and being in a predetermined size (having a thickness between 10 and 200 μm) satisfies a dimension change ratio between before and after the film is left to stand still at a temperature of 135° C. for 30 minutes of ±0.5% or less, and the composition contains a saturated polyester resin. This composition may contain, as required, an additional resin, a coloring agent, additives, and the like in the same manner as the first resin layer.

The third thermoplastic resin composition contains a saturated polyester resin and may contain, as required, an additional resin or polymer.

The saturated polyester resin is preferably a resin obtained by subjecting a dicarboxylic acid component and a glycol component to a polycondensation reaction.

Examples of the dicarboxylic acid component include: an aromatic dicarboxylic acid such as terephthalic acid, isophthalic acid, phthalic acid, 2,6-naphthalene-dicarboxylic acid, diphenyl-dicarboxylic acid, diphenyl-sulfone-dicarboxylic acid, diphenoxy-ethane-dicarboxylic acid, and 5-sodium sulfoisophthalic acid; an aliphatic dicarboxylic acid such as oxalic acid, succinic acid, adipic acid, sebacic acid, dimer acid, maleic acid, and fumaric acid; an alicyclic dicarboxylic acid such as cyclohexyne-dicarboxylic acid; a hydroxycarboxylic acid such as p-oxybenzoic acid; and the like.

Further, examples of the glycol component include: an aliphatic glycol such as ethylene glycol, 1,2-propanediol, 1,3-propanediol, 1,3-butanediol, 1,4-butanediol, 1,5-butanediol, 1,6-hexanediol, and neopentylglycol; a polyoxyalkylene glycol such as diethylene glycol, polyethylene glycol, polypropylene glycol, and polytetramethylene glycol; an alicyclic glycol such as 1,4-cyclohexane dimethanol; an aromatic glycol such as bisphenol A, and bisphenol S; and the like.

These dicarboxylic acid component and glycol component may each be used singly or in combination of two or more types.

Preferable as the saturated polyester resin is a saturated polyester resin which is obtained by subjecting terephthalic acid or dimethyl terephthalate and ethylene glycol to a polycondensation reaction utilizing an esterification reaction or transesterification reaction, and which contains an ethylene terephthalate unit as a main structural unit. When the third thermoplastic resin composition contains at least one kind of the saturated polyester resin having an ethylene terephthalate as a main structural unit, it is allowed to obtain a third resin layer excellent in mechanical strength, processability, heat characteristic, and the like. It is noted that the term "main structural unit" means that the content of ethylene terephthalate constituting one kind of saturated polyester resin is 30% or more by mol. Preferably used as the saturated polyester resin is a polyethylene-2,6-naphthalate resin from viewpoints of strength and heat resistance stability.

Examples of the additional resin include an acrylic resin having a structural unit derived from a (meth)acrylic acid ester compound; an aromatic vinyl-based resin having a structural unit derived from an aromatic vinyl compound; a polyolefin resin; a poly vinyl chloride resin; a poly vinylidene chloride resin; a poly vinyl acetate resin; a polycarbonate resin; a fluorine resin; an ethylene vinyl acetate-based resin; and the like. These may be used singly or in combination of two or more types thereof.

When the third thermoplastic resin composition contains the additional resin, the content thereof is preferably less than 50% by mass, more preferably not more than 40% by mass, and further preferably not more than 30% by mass based on the saturated polyester resin. If the content ratio of the additional resin is too high, the physical properties of the third resin layer according to the present invention may not be maintained and effect of the saturated polyester resin tends to be deteriorated.

The third resin layer may be a colored resin layer or an uncolored resin layer. Thus, the third thermoplastic resin composition may or may not contain a coloring agent.

When the third resin layer is to have a light reflectivity, the third resin layer is allowed to reflect a solar light leaked from between gaps of adjacent solar cell elements toward the backside protective film for solar cell (first resin layer side) and then transmitted through the first resin layer and second resin layer, in a manner to cause the reflected light to backwardly enter the solar cell elements to thereby improve the power generation efficiency.

When the third resin layer is to have a light reflectivity, the third thermoplastic resin composition preferably contains a white-based coloring agent. Examples of the white-based coloring agent include titanium oxide, zinc oxide, calcium carbonate, barium sulfate, calcium sulfate, alumina, silica, $2PbCO_3.Pb(OH)_2$, $[ZnS+BaSO_4]$, talc, gypsum, and the like. The white-based coloring agent may be used singly or in combination of two or more types thereof.

The content of the white-based coloring agent is preferably in the range from 1% to 45% by mass, more preferably from 3% to 40% by mass, and further preferably from 5% to 30% by mass relative to the saturated polyester resin. This allows to achieve a reflectivity of preferably 50% or more relative to a light at a wavelength of 400 to 1,400 nm when the light is irradiated to a surface of the first resin layer. If the content of the white-based coloring agent contained in the third thermoplastic resin composition is too much, flexibility of the backside protective film for solar cell of the present invention may be deteriorated.

The third thermoplastic resin composition may contain other coloring agent such as yellowish coloring agent and bluish coloring agent in addition to the white-based coloring agent. When the other coloring agent is used, the content thereof is usually 10% or less by mass based on the third thermoplastic resin composition.

Specific examples and contents of additives in the case where the third thermoplastic resin composition contains the additives will be described later.

In the present invention, it is preferable that the third resin layer is formed using a heat-treated product of a film containing the saturated polyester resin. In other words, it is possible to use a film-forming resin composition containing the saturated polyester resin to form a film by extrusion molding, inflation molding, calendar molding, or the like, and to subsequently heat treat the film at a temperature ranging from 100° C. to 150° C. for a period of time of about 5 to 120 minutes, to thereby provide a heat-treated film constituting the third resin layer. Further, it is possible to heat treat a commercially available saturated polyester resin film at a temperature ranging from 100° C. to 150° C. for a period of time of about 5 to 120 minutes, to thereby provide a heat-treated film constituting the third resin layer.

The thickness of the third resin layer is in the range from 10 to 300 μm, preferably from 15 to 250 μm, and more preferably from 20 to 200 μm. If the thickness is too small, protective functions at a surface at the third resin layer side is insufficient. On the other hand, if the thickness is too large, flexibility of the backside protective film for solar cell of the present invention is insufficient.

In the following, additives such as other coloring agent, antioxidant, ultraviolet absorber, anti-aging agent, plasticizer and flame retardant) contained in the first resin layer (first thermoplastic resin composition), second resin layer (second thermoplastic resin composition), and third resin layer (third thermoplastic resin composition) are described.

Examples of the antioxidant include a hindered amine-based compound, hydroquinone-based compound, a hindered phenol-based compound, a sulfur-containing compound, a phosphorus-containing compound, and the like. These compounds may be used singly or in combination of two or more types thereof.

The content of the antioxidant is preferably in the range from 0.05% to 10% by mass with respect to the first thermoplastic resin composition, second thermoplastic resin composition, or third thermoplastic resin composition.

Examples of the ultraviolet absorber include a benzophenone-based compound, a benzotriazole-based compound, a triazine-based compound, and the like. These compounds may be used singly or in combination of two or more types thereof.

The content of the ultraviolet absorber is preferably in the range from 0.05% to 10% by mass with respect to the first thermoplastic resin composition, second thermoplastic resin composition, or third thermoplastic resin composition.

Examples of the anti-aging agent include a naphtylamine-based compound, a diphenylamine-based compound, a p-phenylenediamine-based compound, a quinoline-based compound, a hydroquinone derivative-based compound, a monophenol-based compound, a bisphenol-based compound, a trisphenol-based compound, a polyphenol-based compound, a thiobisphenol-based compound, a hindered phenol-based compound, a phosphate ester-based compound, an imidazol-based compound, a dithiocarbamic acid nickel salt-based compound, a phosphate-based compound, and the like. These compounds may be used singly or in combination of two or more types thereof.

The content of the anti-aging agent is preferably in the range from 0.05% to 10% by mass with respect to the first thermoplastic resin composition, second thermoplastic resin composition, or third thermoplastic resin composition.

Examples of the plasticizer include a phthalate ester such as dimethyl phthalate, diethyl phthalate, dibutyl phthalate, diisobutyl phthalate, dioctyl phthalate, butyl octyl phthalate, di-(2-ethylhexyl)phthalate, diisooctyl phthalate and diisodecyl phthalate; a fatty acid ester such as dimethyl adipate, diisobutyl adipate, di-(2-ethylhexyl)adipate, diisooctyl adipate, diisodecyl adipate, octyldecyl adipate, di-(2-ethylhexyl) azelate, diisooctyl azelate, diisobutyl azelate, dibutyl sebacate, di-(2-ethylhexyl)sebacate and diisooctyl sebacate; a trimellitic acid ester such as isodecyl trimellitate, octyl trimellitate, n-octyl trimellitate and isononyl trimellitate; di-(2-ethylhexyl)fumarate, diethylene glycol monooleate, glyceryl monoricinoleate, trilauryl phosphate, tristearyl phosphate, tri-(2-ethylhexyl)phosphate, an epoxidized soybean oil, and the like. These compounds may be used singly or in combination of two or more types thereof.

The content of the plasticizer is preferably in the range from 0.05% to 10% parts by mass with respect to the first thermoplastic resin composition, second thermoplastic resin composition, or third thermoplastic resin composition.

Examples of the flame retardant include an organic-based flame retardant, an inorganic-based flame retardant, a reactive flame retardant and the like. These may be used singly or in combination of two or more types thereof.

Examples of the organic-based flame retardant include a halogen-based flame retardant such as a brominated epoxy-based compound, a brominated alkyltriazine compound, a brominated bisphenol-based epoxy resin, a brominated bisphenol-based phenoxy resin, a brominated bisphenol-based polycarbonate resin, a brominated polystyrene resin, a brominated crosslinked polystyrene resin, a brominated bisphenol cyanurate resin, a brominated polyphenylene ether, a decabromodiphenyl oxide, and tetrabromobisphenol A and an oligomer thereof; a phosphorus-based flame retardant including a phosphoric acid ester such as trimethyl phosphate, triethyl phosphate, tripropyl phosphate, tributyl phosphate, tripentyl phosphate, trihexyl phosphate, tricyclohexyl phosphate, triphenyl phosphate, tricresyl phosphate, trixylenyl phosphate, cresyl diphenyl phosphate, dicresyl phenyl phosphate, dimethyl ethyl phosphate, methyl dibutyl phosphate, ethyl dipropyl phosphate and hydroxyphenyl diphenyl phosphate, as well as compounds obtained by modifying these compounds with various substituents, various condensed phosphoric acid ester compounds, and a phosphazene derivative having elemental phosphorus and nitrogen; polytetrafluoroethylene, a guanidine salt, a silicone-based compound, a phosphazene-based compound and the like. These compounds may be used singly or in combination of two or more types thereof.

Examples of the inorganic flame retardant include aluminum hydroxide, antimony oxide, magnesium hydroxide, zinc borate, a zirconium-based compound, a molybdenum-based compound, zinc stannate and the like. These compounds may be used singly or in combination of two or more types thereof.

Examples of the reactive flame retardant include tetrabromobisphenol A, dibromophenol glycidyl ether, a brominated aromatic triazine, tribromophenol, tetrabromophthalate, tetrachlorophthalic anhydride, dibromoneopentyl glycol, poly(pentabromobenzyl polyacrylate), chlorendic acid (HET acid), chlorendic anhydride (HET anhydride), brominated phenol glycidyl ether, dibromocresyl glycidyl ether and the like. These compounds may be used singly or in combination of two or more types thereof.

The content of the flame retardant is preferably 10% or less parts by mass with respect to the first thermoplastic resin composition, second thermoplastic resin composition, or third thermoplastic resin composition.

When the flame retardant is formulated in the thermplastic resin composition, it is preferable that a flame retardant auxiliary is used together. Examples of the flame retardant auxiliary include an antimony compound such as diantimony trioxide, diantimony tetraoxide, diantimony pentoxide, sodium antimonite and antimony tartrate; zinc borate, barium metaborate, alumina hydrate, zirconium oxide, ammonium polyphosphate, tin oxide, and the like. These may be used singly or in combination of two or more types thereof.

Preferred configurations for the backside protective film for solar cell in the present invention are as follows:
(I) a film where the first resin layer is an infrared transmissible colored resin layer, the second resin layer is a white-based resin layer, and the third resin layer is a white-based resin layer containing a white-based coloring agent; and
(II) a film where the first resin layer is an infrared transmissible colored resin layer, the second resin layer is a white-based resin layer, and the third resin layer is a resin layer which is colored other than white or which is uncolored.

In the present invention, the first resin layer 11, the second resin layer 12, and the third resin layer 13 may be in a continuously laminated state (see FIG. 1). In addition, the first resin layer 11 and the second resin layer 12, and/or the second resin layer 12 and the third resin layer 13 may form a structure (not shown) joined to each other through an adhesive layer. In these cases, the adhesive layer may be of a polyurethane resin composition, or the like.

The production method of the backside protective film for solar cell having the first resin layer, the second resin layer, and the third resin layer is characterized in that the method includes a process in which a film containing a saturated polyester resin is heated at a temperature ranging from 100°

C. to 150° C. in the atmospheric air, to turn the film into a third film having a ratio of dimension change between before and after the film is left to stand still at a temperature of 135° C. for 30 minutes of ±0.5% or less (hereinafter referred to as "first process"), and a process in which a first film containing the rubber containing aromatic vinyl-based resin and the infrared transmissible coloring agent, a second film containing the rubber containing aromatic vinyl-based resin and the white-based coloring agent, and the third film are joined to one another (hereinafter referred to as "second process").

The first process is one in which a film containing a saturated polyester resin is subjected to heat treatment to form a third film.

The film containing the saturated polyester resin to be subjected to heat treatment is consisting of the third thermoplastic resin composition containing a saturated polyester resin. Then, it is possible to adopt a commercially available saturated polyester resin film. In this case, its colored degree, transparency, and the like are not particularly limited. Examples of the commercially available product include a film of "Lumiler E20" (trade name) manufactured by Toray Ind., Inc., "PET Film U2" (trade name) manufactured by Teijin DuPont Films Japan Ltd., "Lumiler X10P" and "Lumiler X10S", "Lumiler X10S" (trade name) manufactured by Toray Ind., Inc., "Melinex 238" (trade name) manufactured by Teijin DuPont Films Japan Ltd., "SR 55" (trade name) manufactured by SKC Co., Ltd., and the like.

A flame retardant film containing a saturated polyester resin preferably exhibits flammability at a surface of the third resin layer side of the backside protective film for solar cell of the present invention in a class of VTM-2 or a class higher than it, in accordance with UL94 standards.

In the first process, the heat treatment temperature is in the range from 100° C. to 150° C., and preferably from 110° C. to 140° C. Excessively higher heat treatment temperature may lead to considerably shrunk films. In turn, excessively lower heat treatment temperature may lead to dimension change ratios exceeding ±0.5%.

Further, the heat treatment time is typically between 5 and 120 minutes, and preferably between 15 and 90 minutes.

The second process is a process in which the first film, second film and third film are joined to one another. Specific examples of the second process include: a method in which the three films are simultaneously joined to one another (hereinafter referred to as "method (21)"); a method in which the first film and second film are joined to each other and then the third film is joined (hereinafter referred to as "method (22)"); a method in which the second film and third film are joined to each other and then the first film is joined (hereinafter referred to as "method (23)"); and the like.

In the case of the method (21), adhesive usage, thermal fusion bonding, dry lamination, and the like are applicable.

Further, in the case of the method (22), it is possible to join the first film and second film to each other by adhesive usage, thermal fusion bonding, dry lamination, or the like to thereby obtain a laminated film, and then to join the surface of the laminated film at the second resin layer side to the third film by adhesive usage, thermal fusion bonding, dry lamination, or the like. It is also possible to obtain a laminated film consisting of the first resin layer and second resin layer by subjecting the first thermoplastic resin composition and second thermoplastic resin composition to coextruding method such as T-die casting film forming method, and then to join the surface of the laminated film at the second resin layer side to the third film by adhesive usage, thermal fusion bonding, dry lamination, or the like.

In the case of the method (23), it is possible to join the second film and third film to each other by adhesive usage, thermal fusion bonding, dry lamination, or the like to thereby obtain a laminated film, and then to join the surface of the laminated film at the second resin layer side to the first film by adhesive usage, thermal fusion bonding, dry lamination, or the like.

Examples of other production method of the backside protective film for solar cell of the present invention include a method in which the first thermoplastic resin composition, second thermoplastic resin composition, and third thermoplastic resin composition that is a composition which is capable of, without conducting the above heat treatment after formation of the film, forming a film having a ratio of dimension change between before and after the film is left to stand still at a temperature of 135° C. for 30 minutes of ±0.5% or less are subjected to coextruding method such as T-die casting film forming method to form a backside protective film for solar cell consisting of the first resin layer, second resin layer, and third resin layer joined to one another.

Meanwhile, it is possible for the backside protective film for solar cell to be provided in a configuration having a water vapor barrier layer 14 between the first resin layer 11 and second resin layer 12, and/or, between the second resin layer 12 and third resin layer 13 (see FIG. 2 to FIG. 4).

The water vapor barrier layer is a layer having such a performance that its water-vapor permeability (hereinafter referred to as "water vapor transmission rate") measured under a condition of a temperature of 40° C. and a humidity of 90% RH in accordance with JIS K7129, is preferably 3 g/(m²·day) or less, more preferably 1 g/(m²·day) or less, and further preferably 0.7 g/(m²·day) or less.

The water vapor barrier layer is preferably a layer consisting of a material having an electric insulation property.

The water vapor barrier layer may have a single-layer structure consisting of one material, or a multi-layer structure, and the water vapor barrier layer may have a multi-layer structure consisting of two or more materials. In the present invention, a vapor deposited film is preferable in which a film layer consisting of a metal and/or a metal oxide is formed on a resin layer surface. The metal and metal oxide may each be a single substance or two or more kinds of substances.

Examples of the metal include aluminum, and the like.

Examples of the metal oxide include an oxide of an element such as silicon, aluminum, magnesium, calcium, potassium, tin, sodium, boron, titanium, lead, zirconium and yttrium. Among them, silicon oxide, aluminum oxide, and the like are particularly preferable, from a viewpoint of water vapor barrier property.

The layer consisting of the metal and/or metal oxide may be formed by a method such as plating, vacuum deposition, ion plating, sputtering, plasma CVD and microwave CVD. It is possible to combine two or more methods with each other.

Examples of the material constituting the resin layer in the vapor deposited film include a polyester film of a polyethylene terephthalate, polyethylene naphthalate, or the like; a polyolefin film of a polyethylene, polypropylene, or the like; a poly vinylidene chloride film; a poly vinyl chloride film; a fluoro resin film; a polysulfone film; a polystyrene film; a polyamide film; a polycarbonate film; a polyacrylonitrile film; a polyimide film; and the like. The thickness of the resin layer is preferably in the range from 5 to 50 μm, and more preferably from 8 to 20 μm.

The water vapor barrier layer may be formed with a commercially available product. Commercially products such as "TECHBARRIER AX" (trade name) manufactured by Mitsubishi Plastics Inc., "GX film" (trade name) manufactured by Toppan Printing Co., Ltd., and "ECOSYAR VE500" (trade name) manufactured by Toyobo Co., Ltd., and the like can be used as a water vapor barrier layer forming sheet (or film).

The water vapor barrier layer between the first resin layer and second resin layer, and/or, between the second resin layer and third resin layer is not particularly limited in arrangement. The film consisting of a metal and/or metal oxide may be faced the first resin layer or third resin layer.

The water vapor barrier layer may be formed of a three-layer type film in which a film consisting of a metal and/or metal oxide is arranged between an upper layer side resin portion and a lower layer side portion.

The thickness of the water vapor barrier layer is preferably in the range from 5 to 300 µm, more preferably from 8 to 250 µm, and further preferably from 10 to 200 µm. If the thickness of the water vapor barrier layer is too small, water vapor barrier property may not be sufficient. On the other hand, if the thickness of the water vapor barrier layer is too large, the flexibility of the backside protective film for solar cell of the present invention may not be sufficient.

When the backside protective film for solar cell of the present invention has a water vapor barrier layer, an adhesive layer can be provided between the first resin layer and/or second resin layer, and the water vapor barrier layer, or between the second resin layer and/or third resin layer, and the water vapor barrier layer. The constituent material of the adhesive layer may be a polyurethane resin composition, an epoxy resin composition, an acrylic resin composition, and the like.

In the case of producing a backside protective film for solar cell having the water vapor barrier layer, it is possible to use the first film, second film, and third film used in the second process of the production method of the above noted backside protective film for solar cell, and a water vapor barrier layer forming sheet (or film).

The backside protective film for solar cell of the present invention is provided in four types of formations, as follows:
(P) a film sequentially having a first resin layer, a second resin layer, and a third resin layer;
(Q) a film sequentially having a first resin layer, a water vapor barrier layer, a second resin layer, and a third resin layer;
(R) a film sequentially having a first resin layer, a second resin layer, a water vapor barrier layer, and a third resin layer; and
(S) a film sequentially having a first resin layer, a water vapor barrier layer, a second resin layer, a water vapor barrier layer, and a third resin layer.

The thickness of the backside protective film for solar cell of the present invention is preferably in the range from 30 to 600 µm, more preferably from 40 to 500 µm, and further preferably from 50 to 400 µm from viewpoints of flexibility, shape followability upon providing the film on another article, workability, and the like.

It is possible to include other layer such as a decorative layer, a coated layer and a layer consisting of a recycled resin brought about upon production, between the first resin layer and second resin layer, or between the second resin layer and third resin layer, as desired and to the extent that the effect of the present invention is not deteriorated.

In the present invention, the production method of the backside protective film for solar cell of the present invention is not particularly limited and is selected depending on constituent materials of the respective layers, namely respective thermoplastic resin compositions.

The above-mentioned production method of the backside protective film for solar cell of the present invention may be applied to the production method of the film according to the embodiment (P).

Examples of the production method of the film according to the embodiment (Q) include a method exemplarily configured to: join a first film containing a rubber containing aromatic vinyl-based resin and infrared transmissible coloring agent and a film for forming the water vapor barrier layer by thermal fusion bonding, dry lamination or adhesive, to form a first laminated film; subsequently join the surface of the first laminated film at the water vapor barrier layer side and a second film containing a rubber containing aromatic vinyl-based resin and white-based coloring agent by an adhesive, to form a second laminated film; and then join the surface of the second laminated film at the second resin layer side and a third film having a dimension change ratio between before and after the film is left to stand still at a temperature of 135° C. for 30 minutes of ±0.5% or less by an adhesive.

Examples of the production method of the film according to the embodiment (R) include a method exemplarily configured to: prepare a first laminated film consisting of a first resin layer and second resin layer; thereafter join the surface of the first laminated film at the second resin layer side and a film for forming the water vapor barrier layer by thermal fusion bonding, dry lamination or adhesive, to form a second laminated film; and then join the surface of the second laminated film at the water vapor barrier layer side and a third film having a dimension change ratio between before and after the film is left to stand still at a temperature of 135° C. for 30 minutes of ±0.5% or less by an adhesive.

Examples of the production method of the film according to the embodiment (S) include a method exemplarily configured to: join a first film containing a rubber containing aromatic vinyl-based resin and infrared transmissible coloring agent and a film for forming the water vapor barrier layer by thermal fusion bonding, dry lamination or adhesive, to form a first laminated film; subsequently join the surface of the first laminated film at the water vapor barrier layer side and a second film containing a rubber containing aromatic vinyl-based resin and white-based coloring agent by an adhesive, to form a second laminated film; thereafter join the surface of the second laminated film at the second resin layer side and a film for forming the water vapor barrier layer by thermal fusion bonding, dry lamination or adhesive, to form a third laminated film; and then join the surface of the third laminated film at the water vapor barrier layer side and a third film having a dimension change ratio between before and after the film is left to stand still at a temperature of 135° C. for 30 minutes of ±0.5% or less by an adhesive.

In the backside protective film for solar cell of the present invention, when a light having a wavelength of 400 to 700 nm is irradiated to a surface of the first resin layer of the backside protective film for solar cell, the absorbance of the light is preferably 60% or higher, more preferably 70% or higher, and further preferably 80% or higher. Higher absorbance leads to lower brightness of the laminated film as viewed from the first resin layer side, thereby forming a dark-colored laminated film. As such, when the backside protective film for solar cell and a transparent member or translucent member are joined to each other at the surface of the first resin layer to thereby prepare a composite member, the same is excellent in external appearance and design as viewed from the transparent member side. For example, when the laminated film is used as a backsheet for solar cell in a manner to once prepare a solar cell module and to thereafter establish it into a solar cell, the solar cell is made to be excellent in external appearance and design when the same is disposed on a roof of a house or the like. It is noted that "the absorbance of the light having a wavelength of 400 to 700 nm is 60% or higher" means that an average value is 60% or higher which is calculated by once measuring absorbances of the light over the wavelength range from 400 to 700 nm at intervals of 20 nm ascendingly from 400 nm or descendingly from 700 nm, and by utilizing the thus measured absorbances, however, it does not demand that the absorbances of the light are 60% or higher throughout the wavelength range.

In the backside protective film for solar cell of the present invention, when a light having a wavelength of 800 to 1,400 nm is irradiated to a surface of the laminated film, the reflectance to the light is preferably 50% or higher, more preferably 60% or higher, and further preferably 70% or higher. Higher reflectance enables to reflect the light having the above wavelength more from the first resin layer. For example, when the laminated film is used as the backsheet for solar cell in a manner to once prepare a solar cell module, the laminated film enables to reflect at least the light having the above wavelength to the solar cell and improve a photoelectric conversion efficiency. It is noted that "the reflectance to the light having a wavelength of 800 to 1,400 nm is 50% or higher" means that an average value is 50% or higher which is calculated by once measuring reflectances to the lights at intervals of 20 nm over the wavelength range from 800 to 1,400 nm ascendingly from 800 nm or descendingly from 1,400 nm, and by utilizing the thus measured reflectances, however, it does not demand that the reflectances to the lights are 50% or higher throughout the wavelength range.

In the backside protective film for solar cell of the present invention having such preferable performance, it is preferable that 60% or higher of a light having a wavelength of 400 to 700 nm irradiated to the first resin layer is absorbed, and a light having a wavelength of 800 to 1,400 nm passes through, and that when the transmitted light arrives at the second resin layer, at least the second layer can reflect the light sufficiently and deformation due to the light can be suppressed. When the laminated film is used as a backsheet for solar cell to prepare a solar cell module by joining the surface of the first resin layer and a filling unit that contains an ethylene vinyl acetate copolymer composition and that has solar cell elements embedded therein, the reflected light can be utilized for photoelectric conversion to improve a power generation efficiency.

Moreover, the backside protective films for solar cell according to embodiments (Q), (R) and (S) are excellent in water vapor barrier property at the first resin layer side or third resin layer side. When the water vapor transmission rate of the backside protective film for solar cell is measured under a condition at a temperature of 40° C. and a humidity of 90% RH according to JIS K7129, the rate is preferably 3 g/(m$^2$·day) or less, and more preferably 1 g/(m$^2$·day) or less. Since such performance is exhibited, when the backside protective film for solar cell of the present invention is used to fabricate a solar cell module, the deterioration of solar cell elements as well as the deterioration of power generation efficiency due to invasion of water, steam or the like can be suppressed and a backside protective film for solar cell excellent in durability can be obtained.

The backside protective film for solar cell of the present invention is excellent in heat resistance and has a dimension change ratio between before and after the film is left to stand still at a temperature of 135° C. for 30 minutes is preferably ±1.5% or less, more preferably ±1.2% or less, and further preferably ±1.0% or less.

Figure 5:
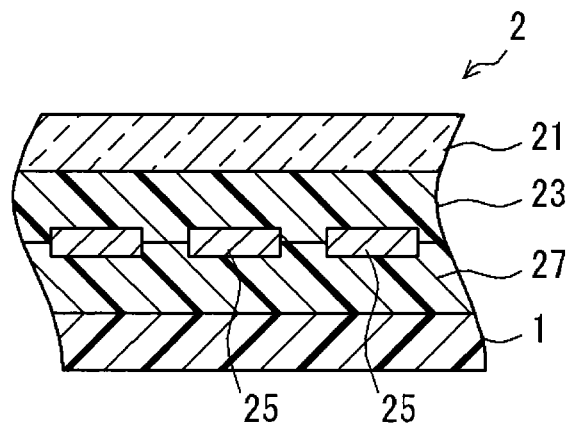
FIG. 5 is a schematic cross-sectional view of an embodiment of a solar cell module.

In the case of using the backside protective film for solar cell of the present invention as a backsheet for solar cell, the schematic view of the solar cell module having the backside protective film of the present invention is shown in FIG. 5.

The solar cell module 2 of FIG. 5 may configure an obverse surface side transparent protective member 21, an obverse surface side sealing film (obverse surface side filling unit) 23, solar cell elements 25, a reverse surface side sealing film (reverse surface side filling unit) 27, and a backside protective film 1 of the present invention, disposed in this sequence from a light receiving face side (upper side in this figure) of the module for solar light. The solar cell module of the present invention may appropriately have, as necessary, various parts in addition to the constituents (not shown).

The obverse surface side transparent protective member 21 is preferably consisting of a material excellent in water vapor barrier property; and a transparent substrate containing a glass, a resin, or the like is typically used. It is noted that, since glass is excellent in transparency and weathering resistance but is insufficient in impact resistance and is heavy, it is preferable to adopt a weather resistant transparent resin in case of establishing a solar cell to be placed on a roof of a house. Examples of the transparent resin include a fluorine-based resin and the like.

The thickness of the obverse surface side transparent protective member 21 is usually in the range from about 1 to 5 mm in case of adopting glass, and is usually in the range from about 0.1 to 5 mm in case of adopting a transparent resin.

The solar cell elements 25 each have a power generating function by receiving a solar light. Usable as such solar cell elements are known ones without particular limitations, insofar as they each have a function to exhibit a photoelectromotive force. Examples thereof include a crystalline silicon solar cell element such as single crystalline silicon type solar cell element and polycrystalline silicon type solar cell element; an amorphous silicon solar cell element having single bond type or tandem structure type; a III-V group compound semiconductor solar cell element such as gallium arsenide (GaAs) and indium phosphorus (InP); a II-VI group compound semiconductor solar cell element such as cadmium tellurium (CdTe) and copper indium selenide (CuInSe$_2$); and the like. Among these, a crystalline silicon solar cell element is preferable, and particularly preferred is a polycrystalline silicon type solar cell element. It is possible to adopt a hybrid element in which an amorphous silicon solar cell element and a thin-film polycrystalline silicon solar cell element, a thin-film microcrystalline silicon solar cell element, or a thin-film crystalline silicon solar cell element are in combination; or the like.

Although not shown in FIG. 5, the solar cell element 25 is usually provided with a wiring electrode and a take-out electrode. The wiring electrode cooperatively has a function to collect electrons generated at multiple solar cell elements by receiving a solar light, and is connected to the solar cell element in a manner to couple the solar cell element at the obverse surface side sealing film (obverse surface side filling unit) 23 side, to the solar cell element at the reverse surface side sealing film (reverse surface side filling unit) 27 side, respectively, for example. Further, the take-out electrode cooperatively has a function to take out electrons collected by the wiring electrode or the like, as an electric current.

The obverse surface side sealing film (obverse surface side filling unit) 23 and the reverse surface side sealing film (reverse surface side filling unit) 27 (hereinafter, collectively referred to as "sealing films") are typically and previously formed into sheet-like or film-like sealing films by using the same sealing film forming material or mutually different ones, and by subsequently and thermally pressure jointing solar cell elements 25 and the like thereto, between the obverse surface side transparent protective member 21 and the backside protective film for solar cell 1.

The thickness of each sealing film (filling unit) is usually in the range from about 100 µm to 4 mm, preferably from about 200 µm to 3 mm, and more preferably from about 300 µm to 2 mm. Excessively smaller thicknesses occasionally lead to damages of the solar cell elements 25, while excessively larger thicknesses disadvantageously lead to increased production costs.

The sealing film forming material is usually a resin composition or a rubber composition. Examples of the resin include an olefin-based resin, an epoxy resin, a poly vinyl butyral resin, and the like. Examples of the rubber include a silicone rubber, a hydrogenated conjugated diene-based rubber, and the like. Among these, an olefin-based resin and a hydrogenated conjugated diene-based rubber are preferable.

Examples of the olefin-based resin include a polymer by polymerization of an olefin or diolefin such as ethylene, propylene, butadiene and isoprene, a copolymer of ethylene and other monomer such as vinyl acetate and an acrylic ester, an ionomer, and the like. Specific example thereof includes a polyethylene, a polypropylene, a polymethylpentene, an ethylene vinyl chloride copolymer, an ethylene vinyl acetate copolymer, an ethylene (meth)acrylic acid ester copolymer, an ethylene vinylalcohol copolymer, a chlorinated polyethylene, a chlorinated polypropylene, and the like. Among these, an ethylene vinyl acetate copolymer and an ethylene (meth) acrylic acid ester copolymer are preferable. Particularly preferred is an ethylene vinyl acetate copolymer.

Examples of the hydrogenated conjugated diene-based rubber include a hydrogenated styrene butadiene rubber, a styrene-ethylenebutylene-olefin crystal block polymer, an olefin crystal-ethylenebutylene-olefin crystal block polymer, a styrene-ethylenebutylene-styrene block polymer, and the like. The preferable is a hydrogenated product of a conjugated diene block copolymer having the following structure, i.e., a block copolymer having at least two kinds of polymer blocks selected from: a polymer block A including an aromatic vinyl compound unit; a polymer block B obtained hydrogenating 80% or more by mol of double bond moieties of a polymer containing a conjugated diene-based compound unit where the content of 1,2-vinyl bond exceeds 25%; a polymer block C obtained hydrogenating 80% or more by mol of double bond moieties of a polymer containing a conjugated diene-based compound unit where the content of 1,2-vinyl bond is 25% or less; and a polymer block D obtained hydrogenating 80% or more by mol of double bond moieties of a copolymer containing an aromatic vinyl compound unit and a conjugated diene-based compound unit.

The sealing film forming material may contain, as required, an additive including a crosslinking agent, a crosslinking aid, a silane coupling agent, a ultraviolet absorber, an antioxidant such as a hindered phenol and a phosphite, a photostabilizer based on a hindered amine, a light diffusing agent, a flame retardant, a discoloration inhibitor, and the like.

As mentioned above, the material for forming the obverse surface side sealing film (obverse surface side filling unit) 23 may be the same as or different from the material for forming the reverse surface side sealing film (reverse surface side filling unit) 27. The former is preferably the same as the latter from a viewpoint of adhesiveness.

The solar cell module of the present invention can be produced by a lamination method, for example, configured to once arrange an obverse surface side transparent protective member, an obverse surface side sealing film, solar cell elements, a reverse surface side sealing film, and a backside protective film for solar cell of the present invention in this order, and to subsequently heat and pressure joint them to one another while conducting vacuuming.

The temperature in laminating method is usually in the range from about 100° C. to 250° C. from a viewpoint of adhesiveness of the backside protective film for solar cell of the present invention. Additionally, the lamination time is usually in the range from about 3 to 30 minutes.

EXAMPLES

Hereinafter, the present invention will be described in detail using Examples, however, the present invention is in no way limited by these Examples without departing from the scope of the invention. In the following, "part(s)" and "%" are based on mass unless otherwise indicated.

1. Evaluation Method

Measuring methods of various evaluation items are as follows.

1-1. Rubber Content in Rubber Containing Aromatic Vinyl-Based Resin

A ratio of the total amount of rubber components in each rubber containing aromatic vinyl-based resin was calculated.

1-2. N-Phenyl Maleimide Unit Content in Rubber Containing Aromatic Vinyl-Based Resin The content of N-phenyl maleimide unit was calculated with regard to the total amount of structural units constituting the rubber containing aromatic vinyl-based resin.

1-3. Glass-Transition Temperature (Tg)

It was measured with a differential scanning calorimeter "DSC2910" (type name) manufactured by TA Instruments in accordance with JIS K7121. When a sample contained two or more thermoplastic resins and plural Tg were obtained on a DSC curve, the even higher Tg was adopted as the applicable one.

1-4. Absorbance (%) of Light Having Wavelength of 400 to 700 nm

A backside protective film (with a size of 50 mm×50 mm, and a thickness listed in the applicable Table) was used as a measurement specimen to measure transmittances and reflectances with UV-VIS-NIR spectrophotometer "V-670" (type name) manufactured by JASCO Corp. Namely, the applicable light was irradiated onto a surface of the first resin layer of the measurement specimen at intervals of 20 nm over the range from 400 nm to 700 nm to measure transmittances and reflectances and calculates average values of the transmittances and reflectances. The absorbance was calculated by the following equation, based on the average value of the transmittances and the average value of the reflectances:

$$\text{Absorbance (\%)}=100-\{\text{transmittance (\%)}+\text{reflectance (\%)}\}.$$

1-5. Reflectance (%) to Light Having Wavelength of 800 to 1,400 nm

The backside protective film (with a size of 50 mm×50 mm, and a thickness listed in the applicable Table) was used as a measurement specimen, and reflectances were measured with UV-VIS-NIR spectrophotometer "V-670" (type name) manufactured by JASCO Corp. Namely, the applicable light was irradiated onto a surface of the first resin layer of the measurement specimen to measure reflectances at intervals of 20 nm over the range from 800 nm to 1,400 nm, and calculate an average value of the reflectances.

1-6. L Value

L values of a surface of the first resin layer side and a surface of the third resin layer side of the backside protective film for solar cell (with a size of 50 mm×50 mm, and a thickness listed in the applicable Table) were measured with a spectrophotometer "TCS-II" (type name) manufactured by Toyo Seiki Seisaku-Sho, Ltd.

1-7. Heat Resistance

The backside protective film for solar cell having a thickness listed in the applicable Table was subjected to cutting to prepare a test piece with a size of 120 mm (MD; resin extruding direction) X 120 mm (TD; direction orthogonal to MD). Subsequently, centrally drawn on the test piece was a square reference line of 100 mm (MD) X 100 mm (TD), and the test piece was left to stand still in a constant temperature bath at a temperature of 135° C. for 30 minutes. Thereafter, the test piece was cooled, and the length of the reference line was measured, to calculate a dimension change ratio using the following equation (11).

Dimension change ratio (%)=[{(length of reference line before heating)−(length of reference line after heating)}/(length of reference line before heating)]×100   (11)

Further, the shape of the test piece after the procedure was visually observed, and judged based on the following criteria:
"3"; deformation was not observed,
"2"; only slight deformation was observed, and
"1"; deformation was observed.

1-8. Flexibility

The backside protective film for solar cell having a thickness listed in the applicable Table was subjected to cutting to prepare a test piece with a size of 100 mm (MD)×100 mm (TD). Subsequently, the test piece was folded along a symmetric axis in the MD direction, followed by further folding along another symmetric axis in the TD direction. The thus folded test piece was subjected to two times a reciprocative movement of an adopted manual pressurizing roll (2,000 g) at a speed of 5 mm/sec, on the fold lines according to JIS Z0237. Thereafter, the test piece was unfolded along the fold lines into an original state, and visually observed to judge it based on the following criterion. That test piece was to be excellent in flexibility, which was not cracked along the fold lines.

"3": the test piece was not cracked along fold lines, and not cracked along the fold lines even after folded and unfolded again;

"2": although the test piece was not cracked along fold lines, it was cracked along the fold lines after folded and unfolded again; and "1": the test piece was cracked along fold lines.

1-9. Adhesiveness to EVA Film

As described above, when the backside protective film for solar cell is used as a member for constituting a solar cell module, this film is used in a manner to adhere the surface of the first resin layer to a reverse surface side sealing film which is formed by embedding solar cell elements contained in the solar cell module. Since an ethylene vinyl acetate copolymer composition is widely used as a material for forming a reverse surface side sealing film, evaluation was conducted for adhesiveness of a surface of the first resin layer of the backside protective film for solar cell to an EVA film described below.

The backside protective film for solar cell was cut into a strip shape (200 mm×15 mm, and a thickness listed in the applicable Table), and two sheets of evaluation-oriented films were obtained therefrom. Arranged between first resin layers of the two sheets of evaluation-oriented films was an EVA film "Ultrapearl" (trade name, manufactured by Sanvic Inc.) which is made of an ethylene vinyl acetate copolymer and has a length of 100 mm, a width of 15 mm, and a thickness of 400 μm, and the resultant assembly in the laminated state was brought into a laminator. Thereafter, the laminator was brought into a vacuumed state at an upper portion and a lower portion thereof, and then preheating was conducted at 150° C. for 5 minutes. Subsequently, the upper portion was brought back to an atmospheric pressure, and then pressing was conducted for 15 minutes, to obtain a specimen for peel strength measurement. In the case of peel strength measurement using the obtained specimen, the evaluation-oriented films were peeled from each other in a T-shaped manner from a location where they were not adhered to the EVA film, to measure a peel strength. Further, the peeled state was observed visually, and judged based on the following criterion:

"2"; the EVA film was broken, and
"1"; separation was caused at an interface between the EVA film and the evaluation-oriented film.

1-10. Improvement Rate of Photoelectric Conversion Efficiency

In a chamber conditioned to a temperature of 25° C.±2° C. and a humidity of 50%±5% RH, Solar Simulator "PEC-11" (type name) manufactured by Peccell Technologies Inc. was used to produce a solar cell module. A glass having a thickness of 3 mm and a backside protective film for solar cell were arranged on an obverse surface and a reverse surface, respectively, of a ¼ polycrystalline silicon cell (50 mm×50 mm) in which the photoelectric conversion efficiency of the cell itself having been measured in advance, in a manner to interpose the silicon cell between the glass and the backside protective film for solar cell, and an EVA was then introduced into between the glass and the film to seal the silicon cell, thereby fabricating a solar cell module. Then, light was irradiated thereto, and a photoelectric conversion efficiency was measured immediately thereafter so as to decrease an influence of temperature. Thus obtained photoelectric conversion efficiency and photoelectric conversion efficiency of the cell itself were used to obtain an improvement rate of photoelectric conversion efficiency:

Improvement rate of photoelectric conversion efficiency (%)={(photoelectric conversion efficiency of module−photoelectric conversion efficiency of cell itself)/(photoelectric conversion efficiency of cell itself)}×100.

1-11. Thermal Cycle Test

Figure 6:
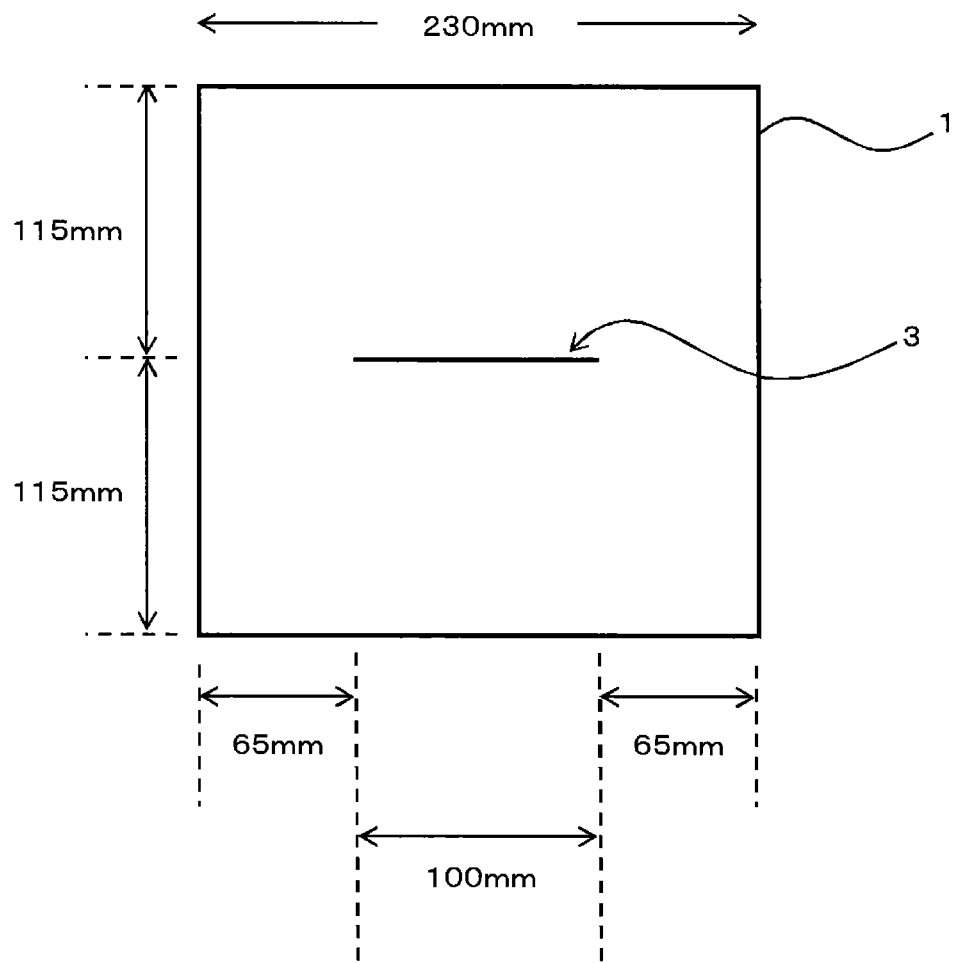
FIG. 6 is a plain view of a backside protective film for solar cell when the film is subjected to thermal cycle test in Examples.

The backside protective film for solar cell was cut into a square shape (230 mm×230 mm, and a thickness listed in the applicable Table), which was then formed with a cutout (100 mm length) at the central portion thereof as shown in FIG. 6.

Figure 7:
FIG. 7 is a schematic cross-sectional view of a laminated body having the backside protective film for solar cell for thermal cycle test in Examples.

Subsequently, two sheets of an EVA film "Ultrapearl" (trade name, manufactured by Sanvic Inc.) which is made of an ethylene vinyl acetate copolymer and has a size of 230 mm×230 mm×400 μm, and a backside protective film for solar cell were sequentially laminated onto a glass plate of 230 mm×230 mm×3 mm (see FIG. 7). The backside protective film for solar cell was disposed so that the surface of the first resin layer was faced to the applicable EVA film. Thereafter, this laminated body was brought into a laminator, and the laminator was brought into a vacuumed state at an upper portion and a lower portion thereof, followed by heating at 150° C. for 5 minutes. Next, the upper portion was brought back to an atmospheric pressure, and then pressing was conducted for 15 minutes, to integrate the laminated body. The thus integrated body was used as a specimen for evaluation, and subjected to a thermal cycle test.

The thermal cycle test was conducted by a thermal shock chamber "TSA-101S-W" (type name) manufactured by ESPEC CORP. Specifically, the specimen for evaluation was repeatedly (200 times) and alternately subjected to a high-temperature condition (for 30 minutes at 100° C.) and a low-temperature condition (for 30 minutes at −40° C.), in a manner to visually observe a state of occurrence of crack from the cutout at the backside protective film for solar cell.

"4": No cracks were caused,
"3": length of crack was shorter than 1 mm,
"2": length of crack was 1 mm or longer, and
"1": crack was caused over the whole surface of the film.

1-12. Water Vapor Barrier Property

The water vapor transmission rate was measured with a water vapor permeability-measuring apparatus "PERMATRAN W3/31" (type name) manufactured by MOCON Inc. under conditions of a temperature of 40° C. and a humidity of 90% RH in accordance with JIS K7129B. A surface of the third resin layer of the backside protective film for solar cell was arranged as a permeable surface at a water vapor side.

1-13. Dimension Change Ratio of Third Resin Layer Forming Film (MD Direction)

A saturated polyester film for forming the third resin layer was subjected to cutting to prepare a test piece with a size of 120 mm (MD; resin extruding direction)×120 mm (TD; direction orthogonal to MD). Subsequently, centrally drawn on the test piece was a square reference line of 100 mm (MD)×100 mm (TD), and the test piece was left to stand still in a constant temperature bath at a temperature of 135° C. for 30 minutes. Thereafter, the test piece was cooled, and the length of the reference line was measured, to calculate a dimension change ratio using the following equation (11).

Dimension change ratio (%)=[{(length of reference line before heating)−(length of reference line after heating)}/(length of reference line before heating)]×100    (11)

Further, the shape of the test piece after the procedure was visually observed, and judged based on the following criteria:
"3"; deformation was not observed,
"2"; only slight deformation was observed, and
"1"; deformation was observed.

2. Raw Materials for Production of Backside Protective Film for Solar Cell 2-1. Silicone-Acryl Composite Rubber Reinforced Aromatic Vinyl-Based Resin (Rubber Reinforced Resin A1-1)

"METABLEN SX-006" (trade name) manufactured by Mitsubishi Rayon Co., Ltd. was used. This is a resin obtained by grafting an acrylonitrile styrene copolymer to a silicone-acryl composite rubber, and has a content of the silicone-acryl composite rubber of 50%, a graft ratio of 80%, an intrinsic viscosity [η] of an acetone soluble component (measured in methyl ethyl ketone at a temperature of 30° C.) of 0.38 dl/g, and a glass transition temperature (Tg) of 135° C.

2-2. Silicone Rubber Reinforced Aromatic Vinyl-Based Resin (Rubber Reinforced Resin A1-2)

1.3 part of p-vinylphenylmethyldimethoxysilane and 98.7 parts of octamethylcyclotetrasiloxane were mixed, and this mixture was charged into 300 parts of distilled water containing 2.0 parts of dodecyl benzenesulfonic acid dissolved therein. A homogenizer was used for stirring for three minutes to emulsify and disperse. The emulsified dispersion was transferred into a separable flask provided with a condenser, a nitrogen inlet, and a stirrer, followed by heating at 90° C. for six hours while stirring. Subsequently, the dispersion was held at 5° C. for 24 hours to complete the condensation and obtain a latex containing a polyorganosiloxane-based rubber. The condensation ratio was 93%. Thereafter, this latex was neutralized to pH7, with an aqueous solution of sodium carbonate. The resulting polyorganosiloxane-based rubber has a volume average particle size of 300 nm.

Subsequently, a batch polymerization component consisting of 100 parts of ion exchange water, 1.5 parts of potassium oleate, 0.01 part of potassium hydroxide, 0.1 part of tert-dodecyl mercaptan, a latex adjusted to pH7 which contains 40 parts of the above-mentioned polyorganosiloxane-based rubber, 15 parts of styrene, and 5 parts of acrylonitrile were charged into a glass-made flask of an inner volume of 7 liters and provided with a stirrer. Stirring was conducted while increasing temperature. 0.1 part of diisopropylbenzene hydroperoxide and an aqueous solution of an activator consisting of 0.1 part of ethylenediamine tetraacetic acid sodium, 0.003 part of ferrous sulfate, 0.2 part of sodium formaldehyde sulfoxylate dihydrate, and 15 parts of ion exchange water were added into the batch polymerization component at a time where the temperature reached 45° C., to conduct polymerization for one hour.

After that, an incremental polymerization component consisting of 50 parts of ion exchange water, 1 part of potassium oleate, 0.02 part of potassium hydroxide, 0.1 part of tert-dodecyl mercaptan, 0.2 part of diisopropylbenzene hydroperoxide, 30 parts of styrene and 10 parts of acrylonitrile were continuously added into the reaction system over three hours to continue the polymerization. After completion of the addition, stirring was continued. After one hour, 0.2 part of 2,2'-methylene-bis(4-ethyl-6-tert-butylphenol) was added into the reaction system to terminate the polymerization and obtain a latex containing a silicone rubber reinforced styrene-based resin (rubber reinforced resin A1-2). Subsequently, 1.5 part of sulfuric acid was added into the latex to solidify a resin component at a temperature of 90° C., followed by conduction of water washing, dewatering, and drying of the resin component, thereby obtaining the silicone rubber reinforced aromatic vinyl-based resin (rubber reinforced resin A1-2). The resin had a glass transition temperature (Tg) of 108° C., a content of the polyorganosiloxane-based runner of 40%, a graft ratio of 84%, and an intrinsic viscosity [η] (measured in methyl ethyl ketone at a temperature of 30° C.) of 0.60 dl/g.

2-3. Acrylic Rubber Reinforced Aromatic Vinyl-Based Resin (Rubber Reinforced Resin A1-3)

50 parts (calculated as solid content) of latex having a solid content concentration of 40% containing an acrylic rubbery polymer (volume average particle size: 100 nm, gel content: 90%) obtained by emulsion polymerization of 99 parts of n-butyl acrylate and 1 part of allyl methacrylate was charged into a reaction vessel, and the latex was diluted by introducing thereinto 1 part of sodium dodecylbenzene sulfonate and 150 parts of ion exchange water. After that, the interior of the reaction vessel was purged with a nitrogen gas; 0.02 part of ethylenediamine tetraacetic acid disodium, 0.005 part of ferrous sulfate, and 0.3 part of sodium formaldehyde sulfoxylate were added and the mixture was heated to 60° C. while stirring.

In turn, 50 parts of a mixture of 37.5 parts of styrene and 12.5 parts of acrylonitrile; 1.0 part of terpinolene; and 0.2 part of cumene hydroperoxide were charged into a reaction vessel and the interior of the reaction vessel was purged with a nitrogen gas to prepare a monomer composition.

Subsequently, the monomer composition was added into the reaction vessel at a constant flow rate over 5 hours in a manner to conduct polymerization at a temperature of 70° C., thereby obtaining a latex. Added into this latex was magnesium sulfate, to solidify the resin component. Thereafter, the solidified component was washed with water and dried, thereby obtaining an acrylic rubber reinforced aromatic vinyl-based resin (rubber reinforced resin A1-3). The content of the acrylic rubbery polymer was 50%, a graft ratio was 93%, an intrinsic viscosity [g] was 0.30 dl/g (at 30° C., in methyl ethyl ketone), and a glass transition temperature (Tg) was 108° C.

2-4. Silicone Rubber Reinforced Aromatic Vinyl-Based Resin (Rubber Reinforced Resin A1-4)

1.3 part of p-vinylphenylmethyldimethoxysilane and 98.7 parts of octamethylcyclotetrasiloxane were mixed, and this mixture was charged into 300 parts of distilled water containing 2.0 parts of dodecyl benzenesulfonic acid dissolved therein. A homogenizer was used for stirring for three minutes to emulsify and disperse. The emulsified dispersion was transferred into a separable flask provided with a condenser, a nitrogen inlet, and a stirrer, followed by heating at 90° C. for six hours while stirring. Subsequently, the dispersion was held at 5° C. for 24 hours to complete the condensation and obtain a latex containing a polyorganosiloxane-based rubber. The condensation ratio was 93%. Thereafter, this latex was neutralized to pH7, with an aqueous solution of sodium carbonate. The resulting polyorganosiloxane-based rubber has a volume average particle size of 300 nm.

Subsequently, a batch polymerization component consisting of 100 parts of ion exchange water, 1.5 part of potassium oleate, 0.01 part of potassium hydroxide, 0.3 part of tert-dodecyl mercaptan, a latex adjusted to pH7 which contains 15 parts of the above-mentioned polyorganosiloxane-based rubber, 18 parts of styrene, and 6 parts of acrylonitrile were charged into a glass-made flask of an inner volume of 7 liters and provided with a stirrer. Stirring was conducted while increasing temperature. 0.03 part of diisopropylbenzene hydroperoxide and an aqueous solution of an activator consisting of 0.1 part of ethylenediamine tetraacetic acid sodium, 0.003 part of ferrous sulfate, 0.2 part of sodium formaldehyde sulfoxylate dihydrate, and 15 parts of ion exchange water were added into the batch polymerization component at a time where the temperature reached 45° C., to conduct polymerization for 1.5 hour.

After that, an incremental polymerization component consisting of 50 parts of ion exchange water, 1 part of potassium oleate, 0.02 part of potassium hydroxide, 0.3 part of tert-dodecyl mercaptan, 0.08 part of diisopropylbenzene hydroperoxide, 45.5 parts of styrene and 15.5 parts of acrylonitrile were continuously added into the reaction system over three hours to continue the polymerization. After completion of the addition, stirring was continued. After one hour, 0.2 part of 2,2'-methylene-bis(4-ethyl-6-tert-butylphenol) was added into the reaction system to terminate the polymerization and obtain a latex containing a silicone rubber reinforced styrene-based resin (rubber reinforced resin A1-4). Subsequently, 1.5 part of sulfuric acid was added into the latex to solidify a resin component at a temperature of 90° C., followed by conduction of water washing, dewatering, and drying of the resin component, thereby obtaining the silicone rubber reinforced aromatic vinyl-based resin (rubber reinforced resin A1-4). The resin had a glass transition temperature (Tg) of 108° C., a content of the polyorganosiloxane-based rubber of 40%, a graft ratio of 40%, and an intrinsic viscosity [η](measured in methyl ethyl ketone at a temperature of 30° C.) of 0.40 dl/g.

2-5. Acrylonitrile Styrene Copolymer (A2-1)

An AS resin "SAN-H" (trade name) manufactured by Techno Polymer Co., Ltd. was used. Its glass-transition temperature (Tg) is 108° C.

2-6. Acrylonitrile Styrene N-Phenyl Maleimide Copolymer (A2-2)

An acrylonitrile styrene N-phenyl maleimide copolymer "POLYIMILEX PAS1460" (trade name) manufactured by NIPPON SHOKUBAI CO., LTD. was used. The polymer has an N-phenyl maleimide unit in an amount of 40%, an acrylonitrile unit amount of 9%, and a styrene unit amount of 51%, and has an Mw of 120,000 determined relative to polystyrene standards by GPC. Its glass-transition temperature (Tg) is 173° C.

2-7. Polyethylene Terephthalate Resin (A3)

A polyethylene terephthalate "Novapex GM700Z" (trade name) manufactured by Mitsubishi Chemical Corp. was used. Its glass-transition temperature (Tg) is 155° C.

2-8. Infrared Transmissible Coloring Agent

A perylene-based black pigment "Lumogen BLACK FK4280" (trade name) manufactured by BASF Corp. was used.

2-9. Yellow Coloring Agent

A quinophthalone-based yellow pigment "Paliotol Yellow K0961HD" (trade name) manufactured by BASF Corp. was used.

2-10. Carbon Black

"Carbon black #45" (trade name) manufactured by Mitsubishi Chemical Corp. was used.

2-11. White-Based Coloring Agent

A titanium oxide "Tipaque CR-60-2" (trade name) manufactured by ISHIHARA SANGYO KAISHA, LTD. was used.

2-12. Third Resin Layer Forming Film (III-1)

A heat-treated film was used which a highly white PET film "Lumiler E20" (trade name) manufactured by Toray Ind., Inc. was subjected to heat treatment at a temperature of 130° C. for 30 minutes after introducing into a constant temperature bath. The thickness is 50 μm. Its glass-transition temperature (Tg) is 70° C. The dimension change ratio (MD) is 0.1%.

2-13. Third Resin Layer Forming Film (III-2)

A heat-treated film was used which a highly white PET film "Lumiler E20" (trade name) manufactured by Toray Ind., Inc. was subjected to heat treatment at a temperature of 130° C. for 30 minutes after introducing into a constant temperature bath. The thickness is 100 μm. Its glass-transition temperature (Tg) is 70° C. The dimension change ratio (MD) is 0.1%.

2-14. Third Resin Layer Forming Film (III-3)

A heat-treated film was used which a highly white PET film "Lumiler X10S" (trade name) manufactured by Toray Ind., Inc. was subjected to heat treatment at a temperature of 130° C. for 30 minutes after introducing into a constant temperature bath. The thickness is 50 μm. Its glass-transition temperature (Tg) is 70° C. The dimension change ratio (MD) is 0.2%.

2-15. Third Resin Layer Forming Film (III-4)

A PET film "Lumiler E20" (trade name) manufactured by Toray Ind., Inc. was used. The thickness is 50 μm. Its glass-transition temperature (Tg) is 70° C. The dimension change ratio (MD) is 1.1%.

2-16. Third Resin Layer Forming Film (III-5)

A PET film "Lumiler E20" (trade name) manufactured by Toray Ind., Inc. was used. The thickness is 100 μm. Its glass-transition temperature (Tg) is 70° C. The dimension change ratio (MD) is 0.9%.

2-17. Third Resin Layer Forming Film (III-6)

A heat-treated film was used which a highly white PET film "Lumiler E20" (trade name) manufactured by Toray Ind., Inc. was subjected to heat treatment at a temperature of 95° C. for 30 minutes after introducing into a constant temperature bath. The thickness is 100 μm. Its glass-transition temperature (Tg) is 70° C. The dimension change ratio (MD) is 0.8%.

2-18. Water Vapor Barrier Layer Forming Film (R-1)

Transparent vapor deposited film "TECHBARRIER LX" (trade name) manufactured by Mitsubishi Plastics Inc. was used. It is a transparent film having a silica vapor deposited on one side of a PET film. The thickness is 12 μm, and a water vapor transmission rate (JIS K7129) is 0.2 g/(m²·day).

2-19. Water Vapor Barrier Layer Forming Film (R-2)

Two components vapor deposited barrier film "ECOSYAR VE500" (trade name) manufactured by TOYOBO Co., Ltd. was used. It is a transparent film having a vapor (silica/alumina) deposited on one side of a PET film. The thickness is 12 μm, and a water vapor transmission rate is 0.5 g/(m²·day).

3. Preparation of First Thermoplastic Resin Composition Production Example 1-1

The rubber reinforced resin (A1-1), acrylonitrile styrene copolymer (A2-1), infrared transmissible coloring agent, and yellow coloring agent were mixed at a ratio shown in Table 1 using Henschel Mixer. Thereafter, the composition was melted and kneaded with a twin-screw extruder "TEX44" (type name) manufactured by The Japan Steel Works, LTD. at a barrel temperature of 240° C., thereby obtaining a first thermoplastic resin composition (I-1) in a form of pellet (see Table 1).

Production Examples 1-2 to 1-4, 1-7 to 1-9, and 1-11

First thermoplastic resin compositions (I-2) to (I-4), (I-7) to (I-9) and (I-11) in a form of pellet were obtained in the same manner as those in Production Example 1-1 except that raw materials in Table 1 were used at ratios shown in Table 1 (see Table 1).

Production Examples 1-5 to 1-6, and 1-10

First thermoplastic resin compositions (I-5) to (I-6) and (I-10) in a form of pellet were obtained in the same manner as those in Production Example 1-1 except that raw materials in Table 1 were used at ratios shown in Table 1 and barrel temperature was set to a temperature of 270° C. (see Table 1).

4. Preparation of Second Thermoplastic Resin Composition Production Example 2-1

The rubber reinforced resin (A1-1), acrylonitrile styrene copolymer (A2-1), and coloring agent (titanium oxide) were mixed at a ratio shown in Table 2 using Henschel Mixer. Thereafter, the composition was melted and kneaded with a twin-screw extruder "TEX44" (type name) manufactured by The Japan Steel Works, LTD. at a barrel temperature of 240° C., thereby obtaining a second thermoplastic resin composition (II-1) in a form of pellet (see Table 2).

Production Examples 2-2 to 2-4 and 2-7 to 2-9

Second thermoplastic resin compositions (II-2) to (II-4) and (II-7) to (II-9) in a form of pellet were obtained in the same manner as those in Production Example 2-1 except that raw materials in Table 2 were used at ratios shown in Table 2 (see Table 2).

Production Examples 2-5 to 2-6

Second thermoplastic resin compositions (II-5) and (II-6) in a form of pellet were obtained in the same manner as those in Production Example 2-1 except that raw materials in Table 2 were used at ratios shown in Table 2 and barrel temperature was set to a temperature of 270° C. (see Table 2).

TABLE 1

| | | Production Example | | | | | | | | | | |
|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 |
| First thermoplastic resin composition | | I-1 | I-2 | I-3 | I-4 | I-5 | I-6 | I-7 | I-8 | I-9 | I-10 | I-11 |
| Amount (part) | Rubber containing aromatic vinyl-based resin | | | | | | | | | | | |
| | Rubber reinforced resin A1-1 | 30 | 30 | | | 30 | 30 | 30 | 30 | 30 | | |
| | Rubber reinforced resin A1-2 | | | 35 | 20 | | | | | | | |
| | Rubber reinforced resin A1-3 | | | | 15 | | | | | | | |
| | Rubber reinforced resin A1-4 | | | | | | | | | | | 100 |
| | Acrylonitrile styrene copolymer A2-1 | 70 | 70 | 65 | 65 | 8 | 30 | 50 | 60 | 70 | | |
| | Acrylonitrile styrene N-phenyl maleimide copolymer A2-2 | | | | | 62 | 40 | 20 | 10 | | | |
| | Polyethylene terephthalate resin A3 | | | | | | | | | | 100 | |
| | Coloring agent | | | | | | | | | | | |
| | Infrared transmissible coloring agent | 2 | 1 | 2 | 2 | 2 | 2 | 2 | 2 | | 2 | 2 |
| | Yellow coloring agent | 1 | 0.5 | 1 | 1 | 1 | 1 | 1 | 1 | | 1 | 1 |
| | Carbon black | | | | | | | | | 2 | | |
| Content | Rubber content *1 (%) | 15 | 15 | 14 | 15.5 | 15 | 15 | 15 | 15 | 15 | 0 | 15 |
| | N-phenyl maleimide unit content *1 (%) | 0 | 0 | 0 | 0 | 24.8 | 16 | 8 | 4 | 0 | 0 | 0 |
| Highest Tg of rubber containing aromatic vinyl-based resin (° C.) | | 107 | 108 | 108 | 107 | 155 | 124 | 116 | 113 | 107 | 70 | 105 |

*1 It is a content based on 100% of the rubber containing aromatic vinyl-based resin.

TABLE 2

|  |  | Production Example | | | | | | | | |
|---|---|---|---|---|---|---|---|---|---|---|
|  |  | 2-1 | 2-2 | 2-3 | 2-4 | 2-5 | 2-6 | 2-7 | 2-8 | 2-9 |
| Second thermoplastic resin composition | | II-1 | II-2 | II-3 | II-4 | II-5 | II-6 | II-7 | II-8 | II-9 |
| Amount (part) | Rubber containing aromatic vinyl-based resin | | | | | | | | | |
|  | Rubber reinforced resin A1-1 | 30 | 30 | | | 30 | 30 | 30 | 30 | |
|  | Rubber reinforced resin A1-2 | | | 35 | 20 | | | | | |
|  | Rubber reinforced resin A1-3 | | | | 15 | | | | | |
|  | Rubber reinforced resin A1-4 | | | | | | | | | 100 |
|  | Acrylonitrile styrene copolymer A2-1 | 70 | 70 | 65 | 65 | 8 | 30 | 50 | 60 | |
|  | Acrylonitrile styrene N-phenyl maleimide copolymer A2-2 | | | | | 62 | 40 | 20 | 10 | |
|  | Coloring agent | | | | | | | | | |
|  | Titanium oxide | 20 | 10 | 20 | 20 | 20 | 20 | 20 | 20 | 20 |
| Content | Rubber content *1 (%) | 15 | 15 | 14 | 15.5 | 15 | 15 | 15 | 15 | 15 |
|  | N-phenyl maleimide unit content *1 (%) | 0 | 0 | 0 | 0 | 24.8 | 16 | 8 | 4 | 0 |
| Highest Tg of rubber containing aromatic vinyl-based resin (° C.) | | 107 | 108 | 108 | 107 | 155 | 124 | 116 | 113 | 105 |

*1 It is a content based on 100% of the rubber containing aromatic vinyl-based resin.

5. Production and Evaluation of Backside Protective Film for Solar Cell (1)

Example 1

A multi-layer type film forming machine provided with two extruders each having a T-die having a die width of 1,400 mm and a lip distance of 1.5 mm, and a screw of 65 mm diameter was used, and the first thermoplastic resin composition (I-1), and second thermoplastic resin composition (II-1) were supplied to the extruders. Then, the molten compositions were discharged from the T-dies at a temperature of 240° C., respectively, to form a two-layer type thin-walled film. After that, this two-layer type thin-walled film was cooled and solidified while being surface-contacted, by air knife, to a cast roll having a surface temperature controlled to be 65° C., to form a two-layer type film having a thickness of 83 μm. The thickness of the film was measured with a thickness gauge "ID-C1112C" (type name) manufactured by Mitutoyo Corp. and was an average value of those measured values which was obtained by once cutting a film piece out of the produced film after a lapse of one hour from commencement of production thereof, and by measuring thicknesses of the film piece at its widthwise center and at points (n=107) at intervals of 10 mm from the widthwise center toward both edges. The values at measured points within a range of 20 mm from each edge of the film piece were excluded from the calculation of the average value.

Subsequently, a film for third resin layer (III-1) described in Table 3 was adhered with a polyurethane-based adhesive onto an outer surface of the second resin layer of the two-layer type film to obtain a backside protective film for solar cell. Various evaluations were conducted for the backside protective film for solar cell. The results are shown in Table 3.

Examples 2 to 12

Backside protective films for solar cell were produced using the first thermoplastic resin composition, second thermoplastic resin composition, film for the third resin layer, and the like described in Table 3 in the same manner as those in Example 1. Various evaluations were conducted for the backside protective films for solar cell. The results are shown in Table 3.

TABLE 3

|  |  |  |  | Example | | | | | | | | | | | |
|---|---|---|---|---|---|---|---|---|---|---|---|---|---|---|---|
|  |  |  |  | 1 | 2 | 3 | 4 | 5 | 6 | 7 | 8 | 9 | 10 | 11 | 12 |
| Backside protective film for solar cell | Layer structure | First resin layer | First thermoplastic resin composition | I-1 | I-2 | I-2 | I-3 | I-4 | I-1 | I-1 | I-2 | I-2 | I-7 | I-8 | I-11 |
|  |  |  | Thickness (μm) | 15 | 31 | 31 | 31 | 31 | 31 | 31 | 62 | 62 | 30 | 31 | 31 |
|  |  | Second resin layer | Second thermoplastic resin composition | II-1 | II-2 | II-2 | II-3 | II-4 | II-1 | II-1 | II-3 | II-4 | II-7 | II-8 | II-9 |
|  |  |  | Thickness (μm) | 68 | 68 | 102 | 69 | 52 | 68 | 102 | 130 | 32 | 69 | 69 | 69 |
|  |  | Adhesive layer | Material | PU | PU | PU | PU | PU | PU | PU | PU | PU | PU | PU | PU |
|  |  |  | Thickness (μm) | 10 | 8 | 8 | 10 | 10 | 8 | 10 | 10 | 10 | 10 | 10 | 10 |
|  |  | Third resin layer | Film for third resin layer | III-1 | III-2 | III-2 | III-2 | III-2 | III-3 | III-3 | III-3 | III-3 | III-2 | III-2 | III-1 |
|  |  |  | Dimension change ratio (%) | 0.1 | 0.1 | 0.1 | 0.1 | 0.1 | 0.2 | 0.2 | 0.2 | 0.2 | 0.1 | 0.1 | 0.1 |
|  |  |  | Thickness (μm) | 50 | 100 | 100 | 100 | 100 | 50 | 50 | 50 | 50 | 100 | 100 | 50 |
|  | Thickness of backside protective film for solar cell (μm) | | | 143 | 207 | 241 | 210 | 193 | 157 | 193 | 252 | 154 | 209 | 210 | 160 |
|  | Evaluation | Average absorbance of light having wavelength of 400-700 nm (%) | | 92 | 90 | 92 | 89 | 89 | 90 | 95 | 92 | 94 | 88 | 89 | 90 |
|  |  | Average reflectance against light having wavelength of 800-1400 nm (%) | | 68 | 61 | 72 | 66 | 66 | 67 | 71 | 73 | 60 | 67 | 65 | 66 |
|  |  | L value at surface of first resin layer side | | 34 | 26 | 27 | 25 | 24 | 26 | 27 | 23 | 23 | 26 | 26 | 25 |

TABLE 3-continued

|  |  | Example | | | | | | | | | | | |
|---|---|---|---|---|---|---|---|---|---|---|---|---|
|  |  | 1 | 2 | 3 | 4 | 5 | 6 | 7 | 8 | 9 | 10 | 11 | 12 |
| L value at surface of third resin layer side | | 86 | 91 | 90 | 90 | 89 | 82 | 83 | 85 | 81 | 89 | 90 | 88 |
| Heat resistance | Dimension change ratio (%) | 0.9 | 0.7 | 0.6 | 0.6 | 0.7 | 0.8 | 0.9 | 0.9 | 0.9 | 0.6 | 0.7 | 0.9 |
|  | Deformation state | 3 | 3 | 3 | 3 | 3 | 3 | 3 | 3 | 3 | 3 | 3 | 3 |
| Flexibility (Bending test) | | 3 | 3 | 3 | 3 | 3 | 3 | 3 | 3 | 3 | 3 | 3 | 3 |
| Adhesiveness | Peel strength (N/mm) | 65 | 66 | 68 | 72 | 68 | 63 | 72 | 63 | 71 | 67 | 69 | 69 |
|  | Peeling state | 2 | 2 | 2 | 2 | 2 | 2 | 2 | 2 | 2 | 2 | 2 | 2 |
| Improvement rate of photoelectric conversion efficiency (%) | | 10 | 8 | 10 | 8 | 8 | 7 | 9 | 8 | 10 | 8 | 8 | 8 |
| Thermal cycle test | | 4 | 4 | 4 | 4 | 3 | 3 | 3 | 3 | 3 | 3 | 3 | 3 |

Comparative Examples 1 to 4 and 16

Backside protective films for solar cell were produced using the first thermoplastic resin composition, second thermoplastic resin composition, film for the third resin layer, and the like described in Tables 4 and 5 in the same manner as those in Example 1. Various evaluations were conducted for the backside protective films for solar cell. The results are shown in Tables 4 and 5.

Comparative Examples 5 to 12

Backside protective films for solar cell were produced using the first thermoplastic resin composition, second thermoplastic resin composition, film for the third resin layer, and the like described in Tables 4 and 5 in the same manner as those in Example 1 except that melting temperature of all compositions for the multi-layer type film forming machine was set to a temperature of 270° C. and the surface temperature of the cast roll was set to a temperature of 95° C. Various evaluations were conducted for the backside protective films for solar cell. The results are shown in Tables 4 and 5.

Comparative Example 13

The first thermoplastic resin composition (I-10) for forming the first resin layer was melted and kneaded at a temperature of 240° C. A film forming machine provided with an extruder having a T-die having a die width of 1,400 mm and a lip distance of 0.4 mm, and a screw of 65 mm diameter was used to form a thin-walled film. After that, this thin-walled film was cooled and solidified while being surface-contacted, by air knife, to a cast roll having a surface temperature controlled to be 65° C., to form a black film having a thickness of 30 μm.

Subsequently, a film for third resin layer (III-5) was adhered with a polyurethane-based adhesive onto an outer surface of the black film to obtain a backside protective film for solar cell having no second resin layer according to the present invention. Various evaluations were conducted for the backside protective film for solar cell. The results are shown in Table 5.

Comparative Examples 14 and 15

The first and second thermoplastic resin compositions shown in Table 5 were used in the same manner as those in Example 1 to form a two-layer type film. After that, the third resin layer was not formed and the two-layer type film was directly used as the backside protective film for solar cell and subjected to various evaluations. The results are shown in Table 5.

TABLE 4

|  |  |  |  | Comparative Example | | | | | | | |
|---|---|---|---|---|---|---|---|---|---|---|---|
|  |  |  |  | 1 | 2 | 3 | 4 | 5 | 6 | 7 | 8 |
| Backside protective film for solar cell | Layer structure | First resin layer | First thermoplastic resin composition | I-1 | I-2 | I-3 | I-7 | I-5 | I-1 | I-5 | I-1 |
|  |  |  | Thickness (μm) | 15 | 31 | 31 | 30 | 32 | 31 | 32 | 31 |
|  |  | Second resin layer | Second thermoplastic resin composition | II-1 | II-2 | II-3 | II-7 | II-5 | II-5 | II-5 | II-5 |
|  |  |  | Thickness (μm) | 68 | 102 | 69 | 69 | 68 | 102 | 68 | 102 |
|  |  | Adhesive layer | Material | PU | PU | PU | PU | PU | PU | PU | PU |
|  |  |  | Thickness (μm) | 10 | 8 | 10 | 10 | 10 | 10 | 10 | 10 |
|  |  | Third resin layer | Film for third resin layer | III-4 | III-5 | III-5 | III-5 | III-5 | III-5 | III-2 | III-2 |
|  |  |  | Dimension change ratio (%) | 1.1 | 0.9 | 0.9 | 0.9 | 0.9 | 0.9 | 0.1 | 0.1 |
|  |  |  | Thickness (μm) | 50 | 100 | 100 | 100 | 100 | 100 | 100 | 100 |
|  | Thickness of backside protective film for solar cell (μm) | | | 143 | 241 | 210 | 209 | 210 | 243 | 210 | 243 |
|  | Evaluation | Average absorbance of light having wavelength of 400-700 nm (%) | | 91 | 92 | 89 | 88 | 92 | 93 | 92 | 93 |
|  |  | Average reflectance against light having wavelength of 800-1400 nm (%) | | 68 | 67 | 65 | 67 | 66 | 72 | 67 | 71 |
|  |  | L value at surface of first resin layer side | | 34 | 26 | 25 | 26 | 26 | 26 | 26 | 28 |
|  |  | L value at surface of third resin layer side | | 88 | 91 | 89 | 88 | 89 | 90 | 89 | 90 |
|  |  | Heat resistance | Dimension change ratio (%) | 3.6 | 2.7 | 2.8 | 1.2 | 0.3 | 0.7 | 0.1 | 0.1 |
|  |  |  | Deformation state | 3 | 3 | 3 | 3 | 3 | 3 | 3 | 3 |
|  |  | Flexibility (Bending test) | | 3 | 3 | 3 | 3 | 3 | 3 | 3 | 3 |

TABLE 4-continued

|  |  | Comparative Example | | | | | | | |
|---|---|---|---|---|---|---|---|---|---|
|  |  | 1 | 2 | 3 | 4 | 5 | 6 | 7 | 8 |
| Adhesiveness | Peel strength (N/mm) | 65 | 67 | 70 | 67 | 66 | 61 | 66 | 61 |
|  | Peeling state | 2 | 2 | 2 | 2 | 2 | 2 | 2 | 2 |
| Improvement rate of photoelectric conversion efficiency (%) | | 10 | 10 | 8 | 8 | 9 | 9 | 9 | 9 |
| Thermal cycle test | | 3 | 4 | 4 | 3 | 1 | 1 | 1 | 1 |

TABLE 5

|  |  |  |  | Comparative Example | | | | | | | |
|---|---|---|---|---|---|---|---|---|---|---|---|
|  |  |  |  | 9 | 10 | 11 | 12 | 13 | 14 | 15 | 16 |
| Backside protective film for solar cell | Layer structure | First resin layer | First thermoplastic resin composition | I-1 | I-1 | I-6 | I-9 | I-10 | I-1 | I-1 | I-3 |
|  |  |  | Thickness (μm) | 32 | 32 | 31 | 30 | 30 | 31 | 31 | 31 |
|  |  | Second resin layer | Second thermoplastic resin composition | II-6 | II-6 | II-1 | II-1 | — | II-2 | II-5 | II-3 |
|  |  |  | Thickness (μm) | 105 | 105 | 105 | 104 | — | 102 | 102 | 69 |
|  |  | Adhesive layer | Material | PU | PU | PU | PU | PU | — | — | PU |
|  |  |  | Thickness (μm) | 10 | 10 | 10 | 10 | 10 | — | — | 10 |
|  |  | Third resin layer | Film for third resin layer | III-5 | III-2 | III-5 | III-5 | III-5 | — | — | III-6 |
|  |  |  | Dimension change ratio (%) | 0.9 | 0.1 | 0.9 | 0.9 | 0.9 | — | — | 0.8 |
|  |  |  | Thickness (μm) | 100 | 100 | 100 | 100 | 100 | — | — | 100 |
|  | Thickness of backside protective film for solar cell (μm) | | | 247 | 247 | 246 | 244 | 140 | 133 | 133 | 210 |
|  | Evaluation | Average absorbance of light having wavelength of 400-700 nm (%) | | 92 | 92 | 93 | 93 | 87 | 88 | 89 | 89 |
|  |  | Average reflectance against light having wavelength of 800-1400 nm (%) | | 70 | 69 | 71 | 5 | 88 | 68 | 68 | 65 |
|  |  | L value at surface of first resin layer side | | 25 | 26 | 26 | 21 | 25 | 25 | 26 | 25 |
|  |  | L value at surface of third resin layer side | | 90 | 89 | 90 | 88 | 89 | 88 | 87 | 89 |
|  |  | Heat resistance | Dimension change ratio (%) | 0.4 | 0.1 | 0.4 | 2.7 | 0.9 | 12.5 | 0.7 | 1.6 |
|  |  |  | Deformation state | 3 | 3 | 3 | 2 | 3 | 1 | 1 | 3 |
|  |  | Flexibility (Bending test) | | 2 | 2 | 2 | 2 | 3 | 2 | 1 | 3 |
|  |  | Adhesiveness | Peel strength (N/mm) | 69 | 69 | 69 | 66 | 12 | 65 | 64 | 70 |
|  |  |  | Peeling state | 2 | 2 | 2 | 2 | 1 | 2 | 2 | 2 |
|  |  | Improvement rate of photoelectric conversion efficiency (%) | | 9 | 9 | 9 | 0 | 6 | 8 | 8 | 8 |
|  |  | Thermal cycle test | | 1 | 1 | 1 | 1 | 4 | 2 | 1 | 4 |

6. Production and Evaluation of Backside Protective Film for Solar Cell (2)

Example 13

A multi-layer type film forming machine provided with two extruders each having a T-die having a die width of 1,400 mm and a lip distance of 1.5 mm, and a screw of 65 mm diameter was used, and the first thermoplastic resin composition (I-2), and second thermoplastic resin composition (II-2) were supplied to the extruders. Then, the molten compositions were discharged from the T-dies at a temperature of 240° C., respectively, to form a two-layer type thin-walled film. After that, this two-layer type thin-walled film was cooled and solidified while being surface-contacted, by air knife, to a cast roll having a surface temperature controlled to be 65° C., to form a two-layer type film having a thickness of 98 μm.

Subsequently, a water vapor barrier layer forming film (R-1) was adhered with a polyurethane-based adhesive onto a surface of the two-layer type film such that a vapor deposited film thereof was brought to an outer surface side. Further, a film for third resin layer (III-1) was adhered with a polyurethane-based adhesive onto a surface of the vapor deposited film of the water vapor barrier layer to obtain a backside protective film for solar cell. Various evaluations were conducted for the backside protective film for solar cell. The results are shown in Table 6.

Example 14

A water vapor barrier layer forming film and a film for third resin layer described in Table 6 were used in the same manner as those in Example 13 to form a backside protective film for solar cell. Various evaluations were conducted for the backside protective film for solar cell. The results are shown in Table 6.

TABLE 6

|  |  |  |  | Example | |
|---|---|---|---|---|---|
|  |  |  |  | 13 | 14 |
| Backside protective film for solar cell | Layer structure | First resin layer | First thermoplastic resin composition | I-2 | I-2 |
|  |  |  | Thickness (μm) | 30 | 30 |

TABLE 6-continued

|  |  |  | Example 13 | Example 14 |
|---|---|---|---|---|
| | Second resin layer | Second thermoplastic resin composition | II-2 | II-2 |
| | | Thickness (μm) | 68 | 68 |
| | Adhesive layer | Material | PU | PU |
| | | Thickness (μm) | 10 | 10 |
| | Water vapor barrier layer | Water vapor barrier layer forming film | R-1 | R-2 |
| | | Thickness (μm) | 12 | 12 |
| | Adhesive layer | Material | PU | PU |
| | | Thickness (μm) | 8 | 8 |
| | Third resin layer | Film for third resin layer | III-1 | III-2 |
| | | Dimension change ratio (%) | 0.1 | 0.1 |
| | | Thickness (μm) | 50 | 100 |
| Thickness of backside protective film for solar cell (μm) | | | 178 | 228 |
| Evaluation | Average absorbance of light having wavelength of 400-700 nm (%) | | 90 | 90 |
| | Average reflectance against light having wavelength of 800-1400 nm (%) | | 69 | 69 |
| | L value at surface of first resin layer side | | 26 | 25 |
| | L value at surface of third resin layer side | | 89 | 91 |
| | Heat resistance | Dimension change ratio (%) | 0.9 | 0.9 |
| | | Deformation state | 3 | 3 |
| | Flexibility (Bending test) | | 2 | 2 |
| | Adhesiveness | Peel strength (N/mm) | 68 | 69 |
| | | Peeling state | 2 | 2 |
| | Improvement rate of photoelectric conversion efficiency (%) | | 8 | 8 |
| | Water vapor barrier property (g/($m^2$ · day)) | | 0.4 | 0.7 |
| | Thermal cycle test | | 4 | 4 |

INDUSTRIAL APPLICABILITY

In the backside protective film having the first resin layer, second resin layer, and third resin layer, which is one embodiment of the present invention, when the first resin layer is subjected to irradiation of light, the back surface protective film is excellently low in heat storage at the first resin layer by virtue of its susceptibility of transmission of infrared light and is excellent in reflectivity at the second resin layer for the light transmitted through the first resin layer. This restricts a thermal deformation of the back surface protective film due to light receipt and the like in a high-temperature environment to attain an improved heat resistance, thereby enabling to keep good design and weather resistance over a long period of time. Further, the back surface protective film is excellent in adhesiveness between the surface of the first resin layer and a member containing an ethylene vinyl acetate copolymer, and is thus excellent in processability and handling ability. Accordingly, the back surface protective film is suitable for such a usage that the applicable product or the like having a supporting part or the like at the third resin layer side and having a member containing an ethylene vinyl acetate copolymer joined to the surface at the first resin layer side, is exposed to a solar light, wind and rain, and the like over a long period of time, for example, thereby requiring a shape stability and the like over a long period of time. Among them, the back surface protective film is useful as a constituent member of a solar cell module constituting a solar cell to be arranged on a roof of a house, building, or the like, i.e., as a backsheet for solar cell. This back surface protective film is excellent in flexibility, so that the same can be disposed, without depending on a shape of a solar cell module, i.e., in conformity to a surface shape of a filler portion for filling gaps among solar cell elements included in the solar cell module, and thus the back surface protective film is desirable for protection of the solar cell elements.

Moreover, in the backside protective film having a water vapor barrier layer between the first resin layer and second resin layer and/or between the second resin layer and third resin layer, in addition to the first resin layer, second resin layer and third resin layer, which is another embodiment of the present invention, when the first resin layer is subjected to irradiation of light, the back surface protective film is excellently low in heat storage at the first resin layer by virtue of its susceptibility of transmission of infrared light and is excellent in reflectivity at the second resin layer for the light transmitted through the first resin layer and water vapor barrier layer. This restricts a thermal deformation of the back surface protective film due to light receipt and the like in a high-temperature environment to attain an improved heat resistance, thereby enabling to keep good design and weather resistance over a long period of time. Further, the back surface protective film is excellent in adhesiveness between the surface of the first resin layer and a member containing an ethylene vinyl acetate copolymer, is also excellent in water vapor barrier property at surfaces of the first and third resin layer sides, and is thus excellent in processability and handling ability. Accordingly, the back surface protective film is suitable for such a usage that the applicable product or the like having a supporting part or the like at the third resin layer side and having a member containing an ethylene vinyl acetate copolymer joined to the surface at the first resin layer side, is exposed to a solar light, wind and rain, and the like over a long period of time, for example, thereby requiring a shape stability and the like over a long period of time. Among them, the back surface protective film is useful as a constituent member of a solar cell module constituting a solar cell to be arranged on a roof of a house, building, or the like, i.e., as a backsheet for solar cell. This back surface protective film is excellent in flexibility, so that the same can be disposed, without depending on a shape of a solar cell module, i.e., in conformity to a surface shape of a filler portion for filling gaps among solar cell elements included in the solar cell module, and thus the back surface protective film is desirable for protection of the solar cell elements.

EXPLANATIONS OF NUMERALS

1: backside protective film for solar cell
11: first resin layer
12: second resin layer
13: third resin layer
14, 14a, and 14b: water vapor barrier layer
2: solar cell module
21: obverse surface side transparent protective member
23: obverse surface side sealing film
25: solar cell element
27: reverse surface side sealing film
3: Incision
5: EVA film
7: glass plate

What is claimed is:

1. A backside protective film, comprising:
a first resin layer, a second resin layer, and a third resin layer sequentially,
wherein said first resin layer is an infrared transmissible colored resin layer comprising a rubber comprising an aromatic vinyl-based resin having a maximum glass transition temperature in a range from 90° C. to 118° C. according to JIS K 7121, and an infrared transmissible coloring agent, and having a thickness in a range from 10 to 300 μm,
wherein said second resin layer is a white-based resin layer comprising a rubber comprising aromatic vinyl-based resin having a maximum glass transition temperature in a range from 90° C. to 118° C. according to JIS K 7121, and a white-based coloring agent, and having a thickness in a range from 10 to 300 μm, and
wherein said third resin layer is a resin layer comprising a saturated polyester resin and having a thickness in a range from 10 to 300 μm, and is a resin layer comprising a film having a ratio of dimension change between before and after the film is left to stand still at a temperature of 135° C. for 30 minutes of ±0.5% or less.

2. The backside protective film of claim 1, wherein said third resin layer is formed with a heat-treated product of a film comprising said saturated polyester resin.

3. The backside protective film of claim 1, wherein said third resin layer further comprises a white-based coloring agent.

4. The backside protective film of claim 1, having an absorbance of a light having a wavelength of 400 to 700 nm of 60% or higher when said light is irradiated to the surface of said first resin layer of said backside protective film.

5. The backside protective film of claim 1, having a reflectance to a light having a wavelength of 800 to 1,400 nm of 50% or higher when said light is irradiated to the surface of said first resin layer of said backside protective film.

6. The backside protective film of claim 1, further comprising:
a water vapor barrier layer between said first resin layer and said second resin layer, or between said second resin layer and said third resin layer.

7. The backside protective film of claim 6, wherein said water vapor barrier layer comprises a vapor deposited film comprising a layer of a metal, a layer of an oxide, or both formed thereon.

8. The backside protective film of claim 1, having a thickness of in a range from 30 to 600 μm.

9. The backside protective film of claim 2, wherein said third resin layer further comprises a white-based coloring agent.

10. The backside protective film of claim 9, having an absorbance of a light having a wavelength of 400 to 700 nm of 60% or higher when said light is irradiated to the surface of said first resin layer of said backside protective film.

11. The backside protective film of claim 9, having a reflectance to a light having a wavelength of 800 to 1,400 nm of 50% or higher when said light is irradiated to the surface of said first resin layer of said backside protective film.

12. The backside protective film of claim 11, having a reflectance to a light having a wavelength of 800 to 1,400 nm of 50% or higher when said light is irradiated to the surface of said first resin layer of said backside protective film.

13. The backside protective film of claim 12, further comprising:
a water vapor barrier layer between said first resin layer and said second resin layer, or between said second resin layer and said third resin layer.

14. The backside protective film of claim 13, wherein said water vapor barrier layer comprises a vapor deposited film comprising a layer of a metal, a layer of an oxide, or both formed thereon.

15. The backside protective film of claim 14, having a thickness of in a range from 30 to 600 μm.

16. A method for producing the backside protective film of claim 1, the method comprising:
heating a film comprising a saturated polyester resin at a temperature in a range from 100° C. to 150° C. in the atmospheric air, to obtain a third film having a ratio of dimension change between before and after said film is left to stand still at a temperature of 135° C. for 30 minutes of ±0.5% or less; and
joining a first film comprising said rubber comprising an aromatic vinyl-based resin and said infrared transmissible coloring agent, a second film comprising said rubber comprising an aromatic vinyl-based resin and said white-based coloring agent, and said third film to one another.

17. A solar cell module, comprising:
said backside protective film of claim 1.

* * * * *